(12) United States Patent
Ohtsuka et al.

(10) Patent No.: US 7,362,789 B2
(45) Date of Patent: Apr. 22, 2008

(54) LASER-DIODE-EXCITED LASER APPARATUS, FIBER LASER APPARATUS, AND FIBER LASER AMPLIFIER IN WHICH LASER MEDIUM DOPED WITH ONE OF $HO^{3+}$, $SM^{3+}$, $EU^{3+}$, $DY^{3+}$, $ER^{3+}$, AND $TB^{3+}$ IS EXCITED WITH GAN-BASED COMPOUND LASER DIODE

(75) Inventors: Hisashi Ohtsuka, Kaisei-machi (JP); Yoji Okazaki, Kaisei-machi (JP); Takayuki Katoh, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 203 days.

(21) Appl. No.: 10/952,760

(22) Filed: Sep. 30, 2004

(65) Prior Publication Data

US 2005/0047469 A1    Mar. 3, 2005

Related U.S. Application Data

(62) Division of application No. 10/143,806, filed on May 14, 2002, now Pat. No. 6,816,532.

(30) Foreign Application Priority Data

May 15, 2001 (JP) .............................. 2001/144466
May 23, 2001 (JP) .............................. 2001/153578
May 25, 2001 (JP) .............................. 2001/157139

(51) Int. Cl.
H01S 3/094 (2006.01)
(52) U.S. Cl. .......................................... 372/75; 372/69
(58) Field of Classification Search ................. 372/69, 372/75, 39; 385/142; 359/341.5
See application file for complete search history.

(56) References Cited

U.S. PATENT DOCUMENTS 5,070,507 A * 12/1991 Anthon ........................ 372/41

(Continued)

FOREIGN PATENT DOCUMENTS

JP    3-86405    4/1991

(Continued)

OTHER PUBLICATIONS

L. Esterowitz et al, Blue light emission by a Pr:LiYF4-laser operated at room temperature, Journal of Applied Physics, vol. 48.No. 2, Feb. 1977, Cambridge, Massachusetts.
D. Sandrock et al, Efficient Continuous Wave-Laser Emission of Pr3+-Doped Fluorides at Room Temperature, Applied Physics B 58, 149-151 (1994), Hamburg, Germany.
R.B. Smart et al, CW room temperature operation of praseodymium-doped fluorozirconate glass fibre lasers in the blue-green, green and red spectral regions, Optics Communications 86 (1991) 337-340, North Holland.

(Continued)

*Primary Examiner*—Minsun Oh Harvey
*Assistant Examiner*—Tuan N. Nguyen
(74) *Attorney, Agent, or Firm*—Sughrue Mion, PLLC

(57) ABSTRACT

A solid-state laser crystal constituting a laser-diode-excited solid-state laser apparatus or an optical fiber constituting a fiber laser apparatus or fiber laser amplifier is doped with one of $Ho^{3+}$, $Sm^{3+}$, $Eu^{3+}$, $Dy^{3+}$, $Er^{3+}$, and $Tb^{3+}$ so that a laser beam is emitted from the solid-state laser crystal or the optical fiber, or incident light of the fiber laser amplifier is amplified, by one of the transitions from $^5S_2$ to $^5I_7$, from $^5S_2$ to $^5I_8$, from $^4G_{5/2}$ to $^6H_{5/2}$, from $^4G_{5/2}$ to $^6H_{7/2}$, from $^4F_{3/2}$ to $^6H_{11/2}$, from $^5D_0$ to $^7F_2$, from $^4F_{9/2}$ to $^6H_{13/2}$, from $^4F_{9/2}$ to $^6H_{11/2}$, from $^4S_{3/2}$ to $^4I_{15/2}$, from $^2H_{9/2}$ to $^4I_{13/2}$, and from $^5D_4$ to $^7F_5$. The above solid-state laser crystal or optical fiber is excited with a GaN-based compound laser diode.

20 Claims, 3 Drawing Sheets

U.S. PATENT DOCUMENTS

| | | | |
|---|---|---|---|
| 5,084,890 A | | 1/1992 | Brierley |
| 5,299,210 A | * | 3/1994 | Snitzer et al. ............... 372/6 |
| 5,366,937 A | * | 11/1994 | Schneider et al. ............ 501/40 |
| 5,388,110 A | | 2/1995 | Snitzer |
| 5,525,932 A | | 6/1996 | Kelkar et al. |
| 5,727,007 A | | 3/1998 | Smart et al. |
| 6,125,132 A | * | 9/2000 | Okazaki ..................... 372/75 |
| 6,154,598 A | | 11/2000 | Gavrilovic et al. |
| 6,277,664 B1 | * | 8/2001 | Lozykowski et al. ......... 438/22 |
| 6,411,432 B1 | | 6/2002 | Kasamatsu |
| 6,490,309 B1 | * | 12/2002 | Okazaki et al. ............... 372/75 |
| 6,510,276 B1 | | 1/2003 | Jain et al. |

FOREIGN PATENT DOCUMENTS

| | | |
|---|---|---|
| JP | 4-318988 | 11/1992 |
| JP | 2001-36168 | 2/2001 |
| JP | 2001-36175 | 2/2001 |

OTHER PUBLICATIONS

Etsuko Ishikawa et al, Rare earth doped fiber for optical amplifiers operating around 1.3 μm, Technical Report of IEICE, LQE95-30 (Jun. 1995) pp. 83-89, Tokyo, Japan.

Chicklis et al., "Deep Red Laser Emission in Ho: YLF," IEEE Journal of Quantum Electronics, vol. QE-13, No. 11, pp. 893-895, Nov. 1997.

Brierley et al., "Lasing at 2.08μm and 1.38μm in a Holmium Doped Fluoro-Zirconate Fibre Laser," Electronics Letters, vol. 24, No. 9, pp. 539-540, Apr. 28, 1988.

* cited by examiner

LASER-DIODE-EXCITED LASER APPARATUS, FIBER LASER APPARATUS, AND FIBER LASER AMPLIFIER IN WHICH LASER MEDIUM DOPED WITH ONE OF $HO^{3+}$, $SM^{3+}$, $EU^{3+}$, $DY^{3+}$, $ER^{3+}$, AND $TB^{3+}$ IS EXCITED WITH GAN-BASED COMPOUND LASER DIODE

CROSS-REFERENCE TO RELATED APPLICATIONS

This is a divisional of application Ser. No. 10/143,806 filed May 14, 2002 now U.S Pat. No. 6,816,532.

The subject matters disclosed in this specification are related to the subject matters disclosed in the following copending, commonly-assigned U.S. patent application:

(1) U.S. Pat. No. 6,125,132 filed by Yoji Okazaki (one of the applicants of the present patent application) on Apr. 28, 1998 and entitled "LASER DIODE PUMPED SOLID STATE LASER, FIBER LASER AND FIBER AMPLIFIER," corresponding to Japanese patent application Nos. 10(1998)-6369 and 10(1998)-6370, which are laid open in Japanese Unexamined Patent Publication Nos. 11(1999)-17266 and 11(1999)-204862; and (2) U.S. Ser. No. 09/621,241 filed by Yoji Okazaki (one of the applicants of the present patent application) and Takayuki Katoh (another of the applicants of the present patent application) on Jul. 21, 2000 and entitled "LASER-DIODE-PUMPED LASER APPARATUS IN WHICH Pr-DOPED LASER MEDIUM IS PUMPED WITH GaN-BASED COMPOUND LASER DIODE," corresponding to Japanese patent application Nos. 11(1999)-206817 and 11(1999)-206573, which are laid open in Japanese Unexamined Patent Publication Nos. 2001-36168 and 2001-36175.

The contents of the above copending, commonly-assigned U.S. patent applications (1) and (2) and the corresponding Japanese patent applications are incorporated in this specification by reference.

BACKGROUND OF THE INVENTION

1. Field of the Invention

The present invention relates to a laser-diode-excited solid-state laser apparatus in which a solid-state laser crystal doped with a rare-earth ion is excited with a laser diode (semiconductor laser) so as to emit a laser beam.

The present invention also relates to a laser-diode-excited solid-state laser apparatus in which a solid-state laser crystal doped with a rare-earth ion is excited with a laser diode (semiconductor laser), and which is arranged to emit ultraviolet light.

The present invention further relates to a laser-diode-excited fiber laser apparatus in which a core of an optical fiber doped with a rare-earth ion is excited with a laser diode (semiconductor laser) so as to emit a laser beam.

The present invention furthermore relates to a laser-diode-excited fiber laser amplifier in which a core of an optical fiber doped with a rare-earth ion is excited with a laser diode (semiconductor laser) so as to amplify incident light by utilizing fluorescence generated by the excitation of the core.

2. Description of the Related Art (1) Solid-state Laser

Gas-laser-excited solid-state laser apparatuses in which a $Pr^{3+}$-doped solid-state laser crystal is excited with a gas laser such as an Ar laser are known as disclosed in Journal of Applied Physics, vol. 48, No. 2, pp. 650-653 (1977) and Applied Physics, B58, pp. 149-151 (1994). These solid-state laser apparatuses can generate a laser beam in a blue wavelength range of 470 to 490 nm by a transition from $^3P_0$ to $^3H_4$ and a laser beam in a green wavelength range of 520 to 550 nm by a transition from $^3P_1$ to $^3H_5$. Therefore, the above solid-state laser apparatuses can be used as light sources for recording a color image in a color sensitive material.

In addition, another solid-state laser apparatus which emits a laser beam having a wavelength in the blue or green wavelength range is known. For example, the Japanese Unexamined Patent Publication No. 4(1992)-318988 corresponding to the Japanese Patent Application No. 3(1991)-086405, which is assigned to the present assignee, discloses a laser-diode-excited solid-state laser apparatus in which a solid-state laser beam is converted into a second harmonic, i.e., the wavelength of the solid-state laser beam is reduced, by arranging a nonlinear optical crystal in a resonator.

Further, InGaN-based compound laser diodes and ZnMgSSe-based compound laser diodes which emit laser beams in the blue and green wavelength ranges have recently been developed.

However, the light sources for use in recording a color image in a color image recording apparatus are required to be small in size, light in weight, and inexpensive. Nevertheless, the above gas-laser-excited solid-state laser apparatus using the $Pr^{3+}$-doped solid-state laser crystal is not suitable for use in recording a color image in a color image recording apparatus since the gas laser in the gas-laser-excited solid-state laser apparatus are large, heavy, and expensive.

On the other hand, since the efficiency of wavelength conversion in the conventional laser-diode-excited solid-state laser apparatuses in which a wavelength of a solid-state laser beam is reduced by using a nonlinear optical crystal is not sufficiently high, it is difficult to obtain high output power. In addition, in such laser-diode-excited solid-state laser apparatuses, an etalon or the like is inserted for limiting the oscillation mode to a single mode. Therefore, loss in the resonator is great, and thus achievement of high output power becomes more difficult.

Further, in order to match phases in the wavelength conversion in the above laser-diode-excited solid-state laser apparatuses, highly accurate temperature control is required, and therefore the outputs of the laser-diode-excited solid-state laser apparatuses are not stable. Furthermore, the numbers of parts are increased by the provision of the nonlinear optical crystal and the etalon. Therefore, the laser-diode-excited solid-state laser apparatuses become expensive.

When InGaN-based compound laser diodes are used, the oscillation wavelengths of the InGaN-based compound laser diodes increase with increase in the indium contents, and theoretically it is possible to obtain laser beams in the blue wavelength range of 470 to 490 nm or in the green wavelength range of 520 to 550 nm. However, since the quality of the crystal deteriorates with the increase in the indium content, it is practically impossible to sufficiently increase the indium content, and the upper limit of the lengthened wavelength is about 450 nm.

In addition, blue light can be obtained by other laser diodes having an active layer made of an InGaNAs or GaNAs material. The oscillation wavelengths in these laser diodes can also be increased by doping the active layer with arsenic. However, since the quality of the crystal also deteriorates with the increase in the arsenic content, the upper limit of the wavelength realizing high output power is about 450 to 460 nm.

Further, the conventional ZnMgSSe-based compound laser diodes cannot continuously oscillate at wavelengths below 500 nm at room temperature, and the lifetimes of the conventional ZnMgSSe-based compound laser diodes are at most about a hundred hours.

In order to solve the above problems, the copending, commonly-assigned U.S. Pat. No. 6,125,132 and the Japanese Unexamined Patent Publication No. 11(1999)-17266 disclose a laser-diode-excited solid-state laser apparatus which is inexpensive, and can emit a laser beam in the blue or green wavelength range with high efficiency, high output power, and high output stability. In this laser-diode-excited solid-state laser apparatus, a $Pr^{3+}$-doped solid-state laser crystal is excited with a GaN-based compound laser diode.

(2) Ultraviolet Laser

Highly efficient, high output power ultraviolet lasers which continuously oscillate in the ultraviolet wavelength range are required, for example, for applications in ultraviolet lithography, fluorometric analysis of organic cells using laser excitation, and the like.

GaN-based compound semiconductor lasers having an active layer made of an InGaN, InGaNAs, or GaNAs material are known as lasers which oscillate in the ultraviolet wavelength range. Recently, GaN-based compound semiconductor lasers which can continuously oscillate for a thousand hours at the wavelength of 400 nm with output power of several milliwatts have been provided.

On the other hand, wavelength-conversion solid-state lasers which output ultraviolet laser beams having wavelengths of 400 nm or below are known. In these wavelength-conversion solid-state lasers, wavelengths of laser oscillation light are shortened to the ultraviolet wavelengths by second harmonic generation (SHG) or third harmonic generation (THG) using nonlinear optical crystals.

However, the conventional GaN-based compound semiconductor lasers cannot emit laser light with output power of 100 mW or more in a single transverse mode, although such laser light is required in many applications. In addition, the oscillation efficiency in the conventional GaN-based compound semiconductor lasers which emit laser light having wavelengths of 380 nm or below is low, and the lifetimes of such GaN-based compound semiconductor lasers are very short.

On the other hand, wavelength-conversion solid-state lasers which output ultraviolet laser beams having wavelengths of 400 nm or below are known. In these wavelength-conversion solid-state lasers, wavelengths of laser oscillation light are shortened to the ultraviolet wavelengths by second harmonic generation (SHG) or third harmonic generation (THG) using nonlinear optical crystals.

However, solid-state laser mediums which realize efficient oscillation in the wavelength range of 700 to 800 nm have not yet been found. Therefore, it is difficult to obtain ultraviolet laser beams with high output power from the wavelength-conversion solid-state lasers in which the wavelengths of the laser light are shortened by second harmonic generation (SHG).

In addition, the efficiency of the wavelength-conversion solid-state lasers in which the wavelengths of the laser light are shortened by third harmonic generation (THG) is essentially low, and the conventional THG wavelength-conversion solid-state lasers can oscillate in only a pulse mode. In order to realize continuous oscillation, i.e., in order to maintain resonance of THG light of the fundamental wave, highly accurate temperature adjustment of a resonator with a precision of 0.01° C. is required. However, such accurate temperature adjustment is practically difficult in terms of cost.

In order to solve the above problems, the copending, commonly-assigned U.S. Ser. No. 09/621,241 and the Japanese Unexamined Patent Publication No. 2001-36175 disclose a laser-diode-excited solid-state laser apparatus in which a solid-state laser beam is converted into a second harmonic by using an optical wavelength conversion element so that ultraviolet light is obtained.

The above laser-diode-excited solid-state laser apparatus comprises: a solid-state laser crystal which is doped with at least one rare-earth ion including at least $Pr^{3+}$; a laser diode which has an active layer made of one of InGaN, InGaNAs, and GaNAs materials, and emits an excitation laser beam for exciting the solid-state laser crystal; and an optical wavelength conversion element which performs wavelength conversion on a solid-state laser beam generated by excitation of the solid-state laser crystal so as to generate ultraviolet laser light.

Although the laser-diode-excited solid-state laser apparatus disclosed in the U.S. Ser. No. 09/621,241 and the Japanese Unexamined Patent Publication No. 2001-36175 can solve the aforementioned problems, the wavelength of the ultraviolet light which can be generated by the disclosed laser-diode-excited solid-state laser apparatus is limited to about 360 nm.

(3) Fiber Laser

As disclosed in the Technical Report of the Institute of Electronics, information and Communication Engineers in Japan, LQE95-30 (1995) p.30 and Optics Communications 86 (1991) p. 337, laser-diode-excited fiber laser apparatuses which comprise a laser diode and an optical fiber having a core made of a $Pr^{3+}$-doped fluoride are known. In the laser-diode-excited fiber laser apparatuses, the optical fiber is excited with the laser diode so as to generate a laser beam.

In addition, as disclosed in the above references, optical fiber amplifiers which comprise a laser diode and an optical fiber having a $Pr^{3+}$-doped core are also known. In these optical fiber amplifiers, the optical fiber is excited with the laser diode so that fluorescent light is generated by the excitation of the optical fiber, and incident light of the optical fiber is amplified by the energy of the fluorescent light when the wavelength of the incident light is included in the wavelength range of the fluorescent light.

Further, Optics Communications 86 (1991) p. 337 discloses an Ar-laser-excited, $Pr^{3+}$-doped fiber laser apparatuses, and laser oscillations at the wavelengths of 491, 520, 605, and 635 nm using excitation light having a wavelength of 476.5 nm have been reported.

The above laser-diode-excited fiber laser apparatuses and Ar-laser-excited, $Pr^{3+}$-doped fiber laser apparatuses can emit blue or green laser beams, and the above optical fiber amplifiers can amplify blue or green laser beams. In this respect, it is considered that these apparatuses and amplifiers can be used as constituents of light sources for recording a color image in a color sensitive material.

However, in order to operate the above Ar-laser-excited, $Pr^{3+}$-doped fiber laser apparatuses or $Pr^{3+}$-doped fiber laser amplifiers with high power of a few watts to several tens of watts, for example, for recording a color image, a water cooling system is necessary. Therefore, the size is increased, and the lifetime and the efficiency are reduced.

In order to solve the above problems, the copending, commonly-assigned U.S. Pat. No. 6,125,132 and the Japanese Unexamined Patent Publication No. 11(1999)-204862 disclose a fiber laser apparatus which can efficiently emit a laser beam in a blue or green wavelength range with high output power and high stability in the output and beam quality, and can be formed in a small size. In this fiber laser apparatus, an optical fiber having a core doped with $Pr^{3+}$ is excited with a GaN-based compound laser diode.

In addition, the U.S. Pat. No. 6,125,132 and the Japanese Unexamined Patent Publication No. 11(1999)-204862 also disclose a fiber laser amplifier which can efficiently amplify a laser beam in a blue or green wavelength range with high output power and high stability in the output and beam quality, and can be formed in a small size. In this fiber laser amplifier, an optical fiber having a core doped with $Pr^{3+}$ is excited with a GaN-based compound laser diode so as to amplify incident light of the optical fiber when the wavelength of the incident light is in the wavelength range of fluorescent light generated by the excitation of the optical fiber.

Further, the U.S. Ser. No. 09/621,241 and the Japanese Unexamined Patent Publication No. 2001-36168 disclose a fiber laser apparatus in which an optical fiber having a core codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$ is excited with a GaN-based compound laser diode. The U.S. Ser. No. 09/621,241 and the Japanese Unexamined Patent Publication No. 2001-36168 also disclose a fiber laser amplifier in which an optical fiber having a core codoped with $Pr^{3+}$ and at least one of $Er^{3+}$, $Ho^{3+}$, $Dy^{3+}$, $Eu^{3+}$, $Sm^{3+}$, $Pm^{3+}$, and $Nd^{3+}$ is excited with a GaN-based compound laser diode so as to amplify incident light of the optical fiber when the wavelength of the incident light is in the wavelength range of fluorescent light generated by the excitation of the optical fiber.

SUMMARY OF THE INVENTION

A first object of the present invention is to provide a laser-diode-excited solid-state laser apparatus which uses a GaN-based compound laser diode as an excitation light source, and can emit laser light in a wide wavelength range which is not covered by the conventional laser-diode-excited solid-state laser apparatuses which uses a $Pr^{3+}$-doped solid-state laser crystal.

A second object of the present invention is to provide a laser-diode-excited solid-state laser apparatus which is inexpensive, and can continuously emit ultraviolet light having a wavelength longer or shorter than 360 nm with high output power and high efficiency.

A third object of the present invention is to provide a fiber laser apparatus which uses a GaN-based compound laser diode as an excitation light source, and can emit laser light in a wide wavelength range which is not covered by the conventional fiber laser apparatuses which use a GaN-based compound laser diode as an excitation light source.

A fourth object of the present invention is to provide a fiber laser amplifier which uses a GaN-based compound laser diode as an excitation light source, and can amplify laser light in a wide wavelength range which is not covered by the conventional fiber laser amplifiers which use a GaN-based compound laser diode as an excitation light source.

(I) According to the first aspect of the present invention, there is provided a laser-diode-excited solid-state laser apparatus including: a GaN-based compound laser diode which emits an excitation laser beam; and a solid-state laser crystal which is doped with $Ho^{3+}$, and emits a solid-state laser beam generated by one of a first transition from $^5S_2$ to $^5I_7$ and a second transition from $^5S_2$ to $^5I_8$ when the solid-state laser crystal is excited with the excitation laser beam.

Preferably, the laser-diode-excited solid-state laser apparatus according to the first aspect of the present invention may also have one or any possible combination of the following additional features (i) to (iii).
(i) The solid-state laser beam is generated by the first transition from $^5S_2$ to $^5I_7$ and is in the wavelength range of 740 to 760 nm.
(ii) The solid-state laser beam is generated by the second transition from $^5S_2$ to $^5I_8$ and is in the wavelength range of 540 to 560 nm.
(iii) The solid-state laser crystal is doped with no rare-earth ion other than $Ho^{3+}$.

The excitation wavelength of the solid-state laser crystal which is doped with $Ho^{3+}$ is 420 nm.

(II) According to the second aspect of the present invention, there is provided a laser-diode-excited solid-state laser apparatus including: a GaN-based compound laser diode which emits an excitation laser beam; and a solid-state laser crystal which is doped with $Sm^{3+}$, and emits a solid-state laser beam generated by one of a first transition from $^4G_{5/2}$ to $^6H_{5/2}$, a second transition from $^4G_{5/2}$ to $^6H_{7/2}$, and a third transition from $^4F_{3/2}$ to $^6H_{11/2}$ when the solid-state laser crystal is excited with the excitation laser beam.

Preferably, the laser-diode-excited solid-state laser apparatus according to the second aspect of the present invention may also have one or any possible combination of the following additional features (i) to (iv).
(i) The solid-state laser beam is generated by the first transition from $^4G_{5/2}$ to $^6H_{5/2}$ and is in the wavelength range of 556 to 576 nm.
(ii) The solid-state laser beam is generated by the second transition from $^4G_{5/2}$ to $^6H_{7/2}$ and is in the wavelength range of 605 to 625 nm.
(iii) The solid-state laser beam is generated by the third transition from $^4F_{3/2}$ to $^6H_{11/2}$ and is in the wavelength range of 640 to 660 nm.
(iv) The solid-state laser crystal is doped wit1h no rare-earth ion other than $Sm^{3+}$.

The excitation wavelength of the solid-state laser crystal which is doped with $Sm^{3+}$ is 404 nm.

(III) According to the third aspect of the present invention, there is provided a laser-diode-excited solid-state laser apparatus including: a GaN-based compound laser diode which emits an excitation laser beam; and a solid-state laser crystal which is doped with $Eu^{3+}$, and emits a solid-state laser beam by a transition from $^5D_0$ to $^7F_2$ when the solid-state laser crystal is excited with the excitation laser beam.

Preferably, the laser-diode-excited solid-state laser apparatus according to the third aspect of the present invention may also have one or any possible combination of the following additional features (i) and (ii).
(i) The solid-state laser beam is in the wavelength range of 579 to 599 nm.
(ii) The solid-state laser crystal is doped with no rare-earth ion other than $Eu^{3+}$.

The excitation wavelength of the solid-state laser crystal which is doped with $Eu^{3+}$ is 394 nm.

(IV) According to the fourth aspect of the present invention, there is provided a laser-diode-excited solid-state laser apparatus including: a GaN-based compound laser diode which emits an excitation laser beam; and a solid-state laser crystal which is doped with $Dy^{3+}$, and emits a solid-state laser beam generated by one of a first transition from $^4F_{9/2}$ to $^6H_{13/2}$ and a second transition from $^4F_{9/2}$ to $^6H_{11/2}$ when the solid-state laser crystal is excited with the excitation laser beam.

Preferably, the laser-diode-excited solid-state laser apparatus according to the fourth aspect of the present invention may also have one or any possible combination of the following additional features (i) to (iii).

(i) The solid-state laser beam is generated by the first transition from $^4F_{9/2}$ to $^6H_{13/2}$ and is in the wavelength range of 562 to 582 nm.

(ii) The solid-state laser beam is generated by the second transition from $^4F_{9/2}$ to $^6H_{11/2}$ and is in the wavelength range of 654 to 674 nm.

(iii) The solid-state laser crystal is doped with no rare-earth ion other than $Dy^{3+}$.

The excitation wavelength of the solid-state laser crystal which is doped with $Dy^{3+}$ is 390 nm.

(V) According to the fifth aspect of the present invention, there is provided a laser-diode-excited solid-state laser apparatus including: a GaN-based compound laser diode which emits an excitation laser beam; and a solid-state laser crystal which is doped with $Er^{3+}$, and emits a solid-state laser beam generated by one of a first transition from $^4S_{3/2}$ to $^4I_{15/2}$ and a second transition from $^2H_{9/2}$ to $^4I_{13/2}$ when the solid-state laser crystal is excited with the excitation laser beam.

Preferably, the laser-diode-excited solid-state laser apparatus according to the fifth aspect of the present invention may also have one or any possible combination of the following additional features (i) to (iii).

(i) The solid-state laser beam is generated by the first transition from $^4S_{3/2}$ to $^4I_{15/2}$ and is in the wavelength range of 530 to 550 nm.

(ii) The solid-state laser beam is generated by the second transition from $^2H_{9/2}$ to $^4I_{13/2}$ and is in the wavelength range of 544 to 564 nm.

(iii) The solid-state laser crystal is doped with no rare-earth ion other than $Er^{3+}$.

The excitation wavelength of the solid-state laser crystal which is doped with $Er^{3+}$ is 406 or 380 nm.

(VI) According to the sixth aspect of the present invention, there is provided a laser-diode-excited solid-state laser apparatus including: a GaN-based compound laser diode which emits an excitation laser beam; and a solid-state laser crystal which is doped with $Tb^{3+}$, and emits a solid-state laser beam generated by a transition from $^5D_4$ to $^7F_5$ when the solid-state laser crystal is excited with the excitation laser beam.

Preferably, the laser-diode-excited solid-state laser apparatus according to the sixth aspect of the present invention may also have one or any possible combination of the following additional features (i) and (ii).

(i) The solid-state laser beam is in the wavelength range of 530 to 550 nm.

(ii) The solid-state laser crystal is doped with no rare-earth ion other than $Tb^{3+}$.

The excitation wavelength of the solid-state laser crystal which is doped with $Tb^{3+}$ is 380 nm.

In addition, in the first to sixth aspects of the present invention, the GaN-based compound laser diode may have an active layer made of one of InGaN, InGaNAs, and GaNAs materials.

(VII) The advantages of the first to sixth aspects of the present invention are as follows.

(i) Since the rare-earth ions, $Ho^{3+}$, $Sm^{3+}$, $Eu^{3+}$, $Dy^{3+}$, $Er^{3+}$, and $Tb^{3+}$ have their absorption bands in the wavelength range of 380 to 420 nm, it is relatively easy to excite the rare-earth ions with a GaN-based compound laser diode. The wavelength range of 380 to 430 nm is a wavelength range in which the GaN-based compound laser diodes can oscillate with relative ease. In particular, the currently available GaN-based compound laser diodes can achieve their maximum output power in the wavelength range of 400 to 410 nm. Therefore, when a solid-state laser crystal doped with at least one of the rare-earth ions, $Ho^{3+}$, $Sm^{3+}$, $Eu^{3+}$, $Dy^{3+}$, $Er^{3+}$, and $Tb^{3+}$ is excited with a GaN-based compound laser diode, it is possible to make a great portion of the excitation light absorbed by the solid-state laser crystal, and achieve high efficiency and high output power.

(ii) In addition, as individually exemplified before, the wavelength bands of the fluorescence generated by the excitation of the solid-state laser crystals doped with the rare-earth ions, $Ho^{3+}$, $Sm^{3+}$, $Eu^{3+}$, $Dy^{3+}$, $Er^{3+}$, and $Tb^{3+}$ are distributed in a wide wavelength range. Therefore, it is possible to realize a laser-diode-excited solid-state laser apparatus which can emit laser light having a wavelength which no laser light capable of being generated by the conventional laser-diode-excited solid-state laser apparatuses has.

(iii) On the other hand, the thermal conductivity coefficients of the GaN-based compound laser diodes are about 130 W/m° C., and much greater than the thermal conductivity coefficients of the ZnMgSSe-based compound laser diodes, which are about 4 W/m° C. In addition, since the dislocation mobility in the GaN-based compound laser diodes is very low, compared with that in the ZnMgSSe-based compound laser diodes, the COD (catastrophic optical damage) thresholds of the GaN-based compound laser diodes are very high. Therefore, it is easy to obtain GaN-based compound laser diodes having a long lifetime and high output power. Since the laser-diode-excited solid-state laser apparatuses according to the first to sixth aspects of the present invention use a GaN-based compound laser diode as an excitation light source, the laser-diode-excited solid-state laser apparatuses according to the first to sixth aspects of the present invention can have a long lifetime, and emit a laser beam with high output power.

(VIII) According to the seventh aspect of the present invention, there is provided a laser-diode-excited solid-state laser apparatus including: a laser diode which has an active layer made of one of InGaN, InGaNAs, and GaNAs materials, and emits an excitation laser beam; a solid-state laser crystal which is doped with at least one rare-earth ion including $Ho^{3+}$, and emits a solid-state laser beam generated by one of a first transition from $^5S_2$ to $^5I_7$ and a second transition from $^5S_2$ to $^5I_8$ when the solid-state laser crystal is excited with the excitation laser beam; and an optical wavelength conversion element which converts the solid-state laser beam into ultraviolet laser light by wavelength conversion.

Preferably, the laser-diode-excited solid-state laser apparatus according to the seventh aspect of the present invention may also have one or any possible combination of the following additional features (i) to (iii).

(i) The solid-state laser beam is generated by the first transition from $^5S_2$ to $^5I_7$ and has a wavelength of about 750 nm, and the ultraviolet laser light has a wavelength of about 375 nm.

(ii) The solid-state laser beam is generated by the second transition from $^5S_2$ to $^5I_8$ and has a wavelength of about 550 nm, and the ultraviolet laser light has a wavelength of about 275 nm.

(iii) The solid-state laser crystal is doped with no rare-earth ion other than $Ho^{3+}$.

The excitation wavelength of the solid-state laser crystal which is doped with $Ho^{3+}$ is 420 nm.

(IX) According to the eighth aspect of the present invention, there is provided a laser-diode-excited solid-state laser apparatus including: a laser diode which has an active layer made of one of InGaN, InGaNAs, and GaNAs materials, and emits an excitation laser beam; a solid-state laser crystal which is doped with at least one rare-earth ion including $Sm^{3+}$, and emits a solid-state laser beam generated by one of a first transition from $^4G_{5/2}$ to $^6H_{5/2}$, a second transition from $^4G_{5/2}$ to $^6H_{7/2}$, and a third transition from $^4F_{3/2}$ to $^6H_{11/2}$ when the solid-state laser crystal is excited with the excitation laser beam; and an optical wavelength conversion element which converts the solid-state laser beam into ultraviolet laser light by wavelength conversion.

Preferably, the laser-diode-excited solid-state laser apparatus according to the eighth aspect of the present invention may also have one or any possible combination of the following additional features (i) to (iv).

(i) The solid-state laser beam is generated by the first transition from $^4G_{5/2}$ to $^6H_{5/2}$ and has a wavelength of about 566 nm, and the ultraviolet laser light has a wavelength of about 283 nm.

(ii) The solid-state laser beam is generated by the second transition from $^4G_{5/2}$ to $^6H_{7/2}$ and has a wavelength of about 615 nm, and the ultraviolet laser light has a wavelength of about 308 nm.

(iii) The solid-state laser beam is generated by the third transition from $^4F_{3/2}$ to $^6H_{11/2}$ and has a wavelength of about 650 nm, and the ultraviolet laser light has a wavelength of about 325 nm.

(iv) The solid-state laser crystal is doped with no rare-earth ion other than $Sm^{3+}$.

The excitation wavelength of the solid-state laser crystal which is doped with $Sm^{3+}$ is 404 nm.

(X) According to the ninth aspect of the present invention, there is provided a laser-diode-excited solid-state laser apparatus including: a laser diode which has an active layer made of one of InGaN, InGaNAs, and GaNAs materials, and emits an excitation laser beam; a solid-state laser crystal which is doped with at least one rare-earth ion including $Eu^{3+}$, and emits a solid-state laser beam generated by a transition from $^5D_0$ to $^7F_2$ when the solid-state laser crystal is excited with the excitation laser beam; and an optical wavelength conversion element which converts the solid-state laser beam into ultraviolet laser light by wavelength conversion.

Preferably, the laser-diode-excited solid-state laser apparatus according to the ninth aspect of the present invention may also have one or any possible combination of the following additional features (i) and (ii).

(i) The solid-state laser beam has a wavelength of about 589 nm, and the ultraviolet laser light has a wavelength of about 295 nm.

(ii) The solid-state laser crystal is doped with no rare-earth ion other than $Eu^{3+}$.

The excitation wavelength of the solid-state laser crystal which is doped with $Eu^{3+}$ is 394 nm.

(XI) According to the tenth aspect of the present invention, there is provided a laser-diode-excited solid-state laser apparatus including: a laser diode which has an active layer made of one of InGaN, InGaNAs, and GaNAs materials, and emits an excitation laser beam; a solid-state laser crystal which is doped with at least one rare-earth ion including $Dy^{3+}$, and emits a solid-state laser beam generated by one of a first transition from $^4F_{9/2}$ to $^6H_{13/2}$ and a second transition from $^4F_{9/2}$ to $^6H_{11/2}$ when the solid-state laser crystal is excited with the excitation laser beam; and an optical wavelength conversion element which converts the solid-state laser beam into ultraviolet laser light by wavelength conversion.

Preferably, the laser-diode-excited solid-state laser apparatus according to the tenth aspect of the present invention may also have one or any possible combination of the following additional features (i) to (iii).

(i) The solid-state laser beam is generated by the first transition from $^4F_{9/2}$ to $^6H_{13/2}$ and has a wavelength of about 572 nm, and the ultraviolet laser light has a wavelength of about 286 nm.

(ii) The solid-state laser beam is generated by the second transition from $^4F_{9/2}$ to $^6H_{11/2}$ and has a wavelength of about 664 nm, and the ultraviolet laser light has a wavelength of about 332 nm.

(iii) The solid-state laser crystal is doped with no rare-earth ion other than $Dy^{3+}$.

The excitation wavelength of the solid-state laser crystal which is doped with $Dy^{3+}$ is 390 nm.

(XII) According to the eleventh aspect of the present invention, there is provided a laser-diode-excited solid-state laser apparatus including: a laser diode which has an active layer made of one of InGaN, InGaNAs, and GaNAs materials, and emits an excitation laser beam; a solid-state laser crystal which is doped with at least one rare-earth ion including $Er^{3+}$, and emits a solid-state laser beam generated by one of a first transition from $^4S_{3/2}$ to $^4I_{15/2}$ and a second transition from $^2H_{9/2}$ to $^4I_{13/2}$ when the solid-state laser crystal is excited with the excitation laser beam; and an optical wavelength conversion element which converts the solid-state laser beam into ultraviolet laser light by wavelength conversion.

Preferably, the laser-diode-excited solid-state laser apparatus according to the eleventh aspect of the present invention may also have one or any possible combination of the following additional features (i) to (iii).

(i) The solid-state laser beam is generated by the first transition from $^4S_{3/2}$ to $^4I_{15/2}$ and has a wavelength of about 540 nm, and the ultraviolet laser light has a wavelength of about 270 nm.

(ii) The solid-state laser beam is generated by the second transition from $^2H_{9/2}$ to $^4I_{13/2}$ and has a wavelength of about 554 nm, and the ultraviolet laser light has a wavelength of about 277 nm.

(iii) The solid-state laser crystal is doped with no rare-earth ion other than $Er^{3+}$.

The excitation wavelength of the solid-state laser crystal which is doped with $Er^{3+}$ is 406 or 380 nm.

In addition, in the seventh to eleventh aspects of the present invention, the optical wavelength conversion element may be realized by a nonlinear optical crystal having a periodic domain-inverted structure.

(XIII) The advantages of the seventh to eleventh aspects of the present invention are as follows.

(i) When a $Ho^{3+}$-doped solid-state laser crystal, e.g., a $Ho^{3+}$-doped YAG crystal, is excited with a GaN-based compound laser diode (at an excitation wavelength of 420 nm), a solid-state laser beam in the near infrared range is generated by a transition from $^5S_2$ to $^5I_7$. Therefore, when this solid-state laser beam is converted into a second harmonic by wavelength conversion using an optical wavelength conversion element, ultraviolet light having a high intensity and a wavelength longer than 360 nm can be obtained. That is, a solid-state laser beam having a wavelength of, for example, about 750 nm can be obtained by the above transition. Thus, when this solid-state laser beam is converted into a second harmonic, ultraviolet light having a high intensity and a wavelength of about 375 nm is obtained.

(ii) In addition, when the $Ho^{3+}$-doped solid-state laser crystal is excited with the GaN-based compound laser diode, a solid-state laser beam having a wavelength of about 550 nm is generated by a transition from $^5S_2$ to $^5I_8$. Therefore, when this solid-state laser beam is converted into a second harmonic by wavelength conversion using an optical wavelength conversion element, ultraviolet light having a high intensity and a wavelength of about 275 nm, which is shorter than 360 nm, is obtained.

(iii) Although the construction for realizing the wavelength conversion of the solid-state laser beam into a third harmonic is complex, the construction for realizing the wavelength conversion of the solid-state laser beam into a second harmonic is simple. Therefore, the laser-diode-excited solid-state laser apparatus using the wavelength conversion into a second harmonic is inexpensive.

(iv) In the laser-diode-excited solid-state laser apparatus according to the eighth aspect of the present invention, in which a $Sm^{3+}$-doped solid-state laser crystal is used, solid-state laser beams having wavelengths of about 566, 615, and 650 nm can be generated by excitation, for example, at the excitation wavelength of 404 nm, as explained before. Therefore, when these solid-state laser beams are converted into second harmonics by wavelength conversion, ultraviolet light beams having wavelengths of about 283, 308, and 325 nm can be obtained, respectively.

(v) In the laser-diode-excited solid-state laser apparatus according to the ninth aspect of the present invention, in which a $Eu^{3+}$-doped solid-state laser crystal is used, a solid-state laser beam having a wavelength of about 589 nm can be generated by excitation, for example, at the excitation wavelength of 394 nm, as explained before. Therefore, when this solid-state laser beam is converted into a second harmonic by wavelength conversion, an ultraviolet light beam having a wavelength of about 295 nm can be obtained.

(vi) In the laser-diode-excited solid-state laser apparatus according to the tenth aspect of the present invention, in which a $Dy^{3+}$-doped solid-state laser crystal is used, solid-state laser beams having wavelengths of about 572 and 664 nm can be generated by excitation, for example, at the excitation wavelength of 390 nm, as explained before. Therefore, when these solid-state laser beams are converted into second harmonics by wavelength conversion, ultraviolet light beams having wavelengths of about 286 and 332 nm can be obtained, respectively.

(vii) In the laser-diode-excited solid-state laser apparatus according to the eleventh aspect of the present invention, in which an $Er^{3+}$-doped solid-state laser crystal is used, solid-state laser beams having wavelengths of about 540 and 554 nm can be generated by excitation, for example, at the excitation wavelength of 406 or 380 nm, as explained before. Therefore, when these solid-state laser beams are converted into second harmonics by wavelength conversion, ultraviolet light beams having wavelengths of about 270 and 277 nm can be obtained, respectively.

(viii) As explained before, the rare-earth ions, $Ho^{3+}$, $Sm^{3+}$, $Eu^{3+}$, $Dy^{3+}$, and $Er^{3+}$ have their absorption bands in the wavelength range of 380 to 420 nm, in which the currently available GaN-based compound laser diodes can easily oscillate. In particular, the currently available GaN-based compound laser diodes can achieve their maximum output power in the wavelength range of 400 to 410 nm. Since the solid-state laser crystals respectively doped with the rare-earth ions, $Ho^{3+}$, $Sm^{3+}$, $Eu^{3+}$, $Dy^{3+}$, and $Er^{3+}$ are excited with a GaN-based compound laser diode in the laser-diode-excited solid-state laser apparatuses according to the seventh to eleventh aspects of the present invention, a great portion of the excitation light is absorbed by the solid-state laser crystal, and high efficiency and high output power can be achieved.

(ix) In addition, as explained before, the GaN-based compound laser diodes have a great thermal conductivity coefficient and a high COD (catastrophic optical damage) threshold. Therefore, it is easy to obtain GaN-based compound laser diodes having a long lifetime and high output power. The laser-diode-excited solid-state laser apparatuses according to the seventh to eleventh aspects of the present invention, in which a GaN-based compound laser diode is used as an excitation light source, can have a long lifetime, and emit a laser beam with high output power.

(XIV) According to the twelfth aspect of the present invention, there is provided a fiber laser apparatus including: a GaN-based compound laser diode which emits a first laser beam; and an optical fiber which has a core doped with $Ho^{3+}$, and emits a second laser beam generated by one of a first transition from $^5S_2$ to $^5I_7$ and a second transition from $^5S_2$ to $^5I_8$ when the optical fiber is excited with the first laser beam.

Preferably, the fiber laser apparatus according to the twelfth aspect of the present invention may also have one or any possible combination of the following additional features (i) to (iii).

(i) The second laser beam is generated by the first transition from $^5S_2$ to $^5I_7$ and is in the wavelength range of 740 to 760 nm.

(ii) The second laser beam is generated by the second transition from $^5S_2$ to $^5I_8$ and is in the wavelength range of 540 to 560 nm.

(iii) The core of the optical fiber is doped with no rare-earth ion other than $Ho^{3+}$.

The excitation wavelength of the core of the optical fiber doped with $Ho^{3+}$ is 420 nm.

(XV) According to the thirteenth aspect of the present invention, there is provided a fiber laser apparatus including: a GaN-based compound laser diode which emits a first laser beam; and an optical fiber which has a core doped with $Sm^{3+}$, and emits a second laser beam generated by one of a first transition from $^4G_{5/2}$ to $^6H_{5/2}$, a second transition from $^4G_{5/2}$ to $^6H_{7/2}$, and a third transition from $^4F_{3/2}$ to $^6H_{11/2}$ when the optical fiber is excited with the first laser beam.

Preferably, the fiber laser apparatus according to the thirteenth aspect of the present invention may also have one or any possible combination of the following additional features (i) to (iv).

(i) The second laser beam is generated by the first transition from $^4G_{5/2}$ to $^6H_{5/2}$ and is in the wavelength range of 556 to 576 nm.

(ii) The second laser beam is generated by the second transition from $^4G_{5/2}$ to $^6H_{7/2}$ and is in the wavelength range of 605 to 625 nm.

(iii) The second laser beam is generated by the third transition from $^4F_{3/2}$ to $^6H_{11/2}$ and is in the wavelength range of 640 to 660 nm.

(iv) The core of the optical fiber is doped with no rare-earth ion other than $Sm^{3+}$.

The excitation wavelength of the core of the optical fiber doped with $Sm^{3+}$ is 404 nm.

(XVI) According to the fourteenth aspect of the present invention, there is provided a fiber laser apparatus including: a GaN-based compound laser diode which emits a first laser beam; and an optical fiber which has a core doped with $Eu^{3+}$, and emits a second laser beam generated by a transition from $^5D_0$ to $^7F_2$ when the optical fiber is excited with the first laser beam.

Preferably, the fiber laser apparatus according to the fourteenth aspect of the present invention may also have one or any possible combination of the following additional features (i) and (ii).

(i) The second laser beam is in the wavelength range of 579 to 599 nm.

(ii) The core of the optical fiber is doped with no rare-earth ion other than $Eu^{3+}$.

The excitation wavelength of the core of the optical fiber doped with $Eu^{3+}$ is 394 nm.

(XVII) According to the fifteenth aspect of the present invention, there is provided a fiber laser apparatus including: a GaN-based compound laser diode which emits a first laser beam; and an optical fiber which has a core doped with $Dy^{3+}$, and emits a second laser beam generated by one of a first transition from $^4F_{9/2}$ to $^6H_{13/2}$ and a second transition from $^4F_{9/2}$ to $^6H_{11/2}$ when the optical fiber is excited with the first laser beam.

Preferably, the fiber laser apparatus according to the fifteenth aspect of the present invention may also have one or any possible combination of the following additional features (i) to (iii).

(i) The second laser beam is generated by the first transition from $^4F_{9/2}$ to $^6H_{13/2}$ and is in the wavelength range of 562 to 582 nm.

(ii) The second laser beam is generated by the second transition from $^4F_{9/2}$ to $^6H_{11/2}$ and is in the wavelength range of 654 to 674 nm.

(iii) The core of the optical fiber is doped with no rare-earth ion other than $Dy^{3+}$.

The excitation wavelength of the core of the optical fiber doped with $Dy^{3+}$ is 390 nm.

(XVIII) According to the sixteenth aspect of the present invention, there is provided a fiber laser apparatus including: a GaN-based compound laser diode which emits a first laser beam; and an optical fiber which has a core doped with $Er^{3+}$, and emits a second laser beam generated by one of a first transition from $^4S_{3/2}$ to $^4I_{15/2}$ and a second transition from $^2H_{9/2}$ to $^4I_{13/2}$ when the optical fiber is excited with the first laser beam.

Preferably, the fiber laser apparatus according to the sixteenth aspect of the present invention may also have one or any possible combination of the following additional features (i) to (iii).

(i) The second laser beam is generated by the first transition from $^4S_{3/2}$ to $^4I_{15/2}$ and is in the wavelength range of 530 to 550 nm.

(ii) The second laser beam is generated by the second transition from $^2H_{9/2}$ to $^4I_{13/2}$ and is in the wavelength range of 544 to 564 nm.

(iii) The core of the optical fiber is doped with no rare-earth ion other than $Er^{3+}$.

The excitation wavelength of the core of the optical fiber doped with $Er^{3+}$ is 406 or 380 nm.

(XIX) According to the seventeenth aspect of the present invention, there is provided a fiber laser apparatus including: a GaN-based compound laser diode which emits a first laser beam; and an optical fiber which has a core doped with $Tb^{3+}$, and emits a second laser beam generated by a transition from $^5D_4$ to $^7F_5$ when the optical fiber is excited with the first laser beam.

Preferably, the fiber laser apparatus according to the seventeenth aspect of the present invention may also have one or any possible combination of the following additional features (i) to (iii).

(i) The second laser beam is in the wavelength range of 530 to 550 nm.

(ii) The core of the optical fiber is doped with no rare-earth ion other than $Tb^{3+}$.

The excitation wavelength of the core of the optical fiber doped with $Tb^{3+}$ is 380 nm.

(XX) According to the eighteenth aspect of the present invention, there is provided a fiber laser amplifier including: a GaN-based compound laser diode which emits an excitation laser beam; and an optical fiber which has a core doped with $Ho^{3+}$, and amplifies incident light which has a wavelength within a wavelength range of fluorescence generated by one of a first transition from $^5S_2$ to $^5I_7$ and a second transition from $^5S_2$ to $^5I_8$ when the optical fiber is excited with the excitation laser beam.

Preferably, the fiber laser amplifier according to the eighteenth aspect of the present invention may also have one or any possible combination of the following additional features (i) to (iii).

(i) The fluorescence is generated by the first transition from $^5S_2$ to $^5I_7$ and is in the wavelength range of 740 to 760 nm.

(ii) The fluorescence is generated by the second transition from $^5S_2$ to $^5I_8$ and is in the wavelength range of 540 to 560 nm.

(iii) The core of the optical fiber is doped with no rare-earth ion other than $Ho^{3+}$.

The excitation wavelength of the optical fiber which is doped with $Ho^{3+}$ is 420 nm.

(XXI) According to the nineteenth aspect of the present invention, there is provided a fiber laser amplifier including: a GaN-based compound laser diode which emits an excitation laser beam; and an optical fiber which has a core doped with $Sm^{3+}$, and amplifies incident light which has a wavelength within a wavelength range of fluorescence generated by one of a first transition from $^4G_{5/2}$ to $^6H_{5/2}$, a second transition from $^4G_{5/2}$ to $^6H_{7/2}$, and a third transition from $^4F_{3/2}$ to $^6H_{11/2}$ when the optical fiber is excited with the excitation laser beam.

Preferably, the fiber laser amplifier according to the nineteenth aspect of the present invention may also have one or any possible combination of the following additional features (i) to (iv).

(i) The fluorescence is generated by the first transition from $^4G_{5/2}$ to $^6H_{5/2}$ and is in the wavelength range of 556 to 576 nm.

(ii) The fluorescence is generated by the second transition from $^4G_{5/2}$ to $^6H_{7/2}$ and is in the wavelength range of 605 to 625 nm.

(iii) The fluorescence is generated by the third transition from $^4F_{3/2}$ to $^6H_{11/2}$ and is in the wavelength range of 640 to 660 nm.

(iv) The core of the optical fiber is doped with no rare-earth ion other than $Sm^{3+}$.

The excitation wavelength of the core of the optical fiber doped with $Sm^{3+}$ is 404 nm.

(XXII) According to the twentieth aspect of the present invention, there is provided a fiber laser amplifier including: a GaN-based compound laser diode which emits an excitation laser beam; and an optical fiber which has a core doped with $Eu^{3+}$, and amplifies incident light which has a wavelength within a wavelength range of fluorescence generated by a transition from $^5D_0$ to $^7F_2$ when the optical fiber is excited with the excitation laser beam.

Preferably, the fiber laser amplifier according to the twentieth aspect of the present invention may also have one or any possible combination of the following additional features (i) and (ii).

(i) The fluorescence is in the wavelength range of 579 to 599 nm.
(ii) The core of the optical fiber is doped with no rare-earth ion other than $Eu^{3+}$.

The excitation wavelength of the core of the optical fiber doped with $Eu^{3+}$ is 394 nm.

(XXIII) According to the twenty-first aspect of the present invention, there is provided a fiber laser amplifier including: a GaN-based compound laser diode which emits an excitation laser beam; and an optical fiber which has a core doped with $Dy^{3+}$, and amplifies incident light which has a wavelength within a wavelength range of fluorescence generated by one of a first transition from $^4F_{9/2}$ to $^6H_{13/2}$ and a second transition from $^4F_{9/2}$ to $^6H_{11/2}$ when the optical fiber is excited with the excitation laser beam.

Preferably, the fiber laser amplifier according to the twenty-first aspect of the present invention may also have one or any possible combination of the following additional features (i) to (iii).

(i) The fluorescence is generated by the first transition from $^4F_{9/2}$ to $^6H_{13/2}$ and is in the wavelength range of 562 to 582 nm.
(ii) The fluorescence is generated by the second transition from $^4F_{9/2}$ to $^6H_{13/2}$ and is in the wavelength range of 654 to 674 nm.
(iii) The core of the optical fiber is doped with no rare-earth ion other than $Dy^{3+}$.

The excitation wavelength of the optical fiber which is doped with $Dy^{3+}$ is 390 nm.

(XXIV) According to the twenty-second aspect of the present invention, there is provided a fiber laser amplifier including: a GaN-based compound laser diode which emits an excitation laser beam; and an optical fiber which has a core doped with $Er^{3+}$, and amplifies incident light which has a wavelength within a wavelength range of fluorescence generated by one of a first transition from $^4S_{3/2}$ to $^4I_{15/2}$ and a second transition from $^2H_{9/2}$ to $^4I_{13/2}$ when the optical fiber is excited with the excitation laser beam.

Preferably, the fiber laser amplifier according to the twenty-second aspect of the present invention may also have one or any possible combination of the following additional features (i) to (iii).

(i) The fluorescence is generated by the first transition from $^4S_{3/2}$ to $^4I_{15/2}$ and is in the wavelength range of 530 to 550 nm.
(ii) The fluorescence is generated by the second transition from $^2H_{9/2}$ to $^4I_{13/2}$ and is in the wavelength range of 544 to 564 nm.
(iii) The core of the optical fiber is doped with no rare-earth ion other than $Er^{3+}$.

The excitation wavelength of the core of the optical fiber doped with $Er^{3+}$ is 406 or 380 nm.

(XXV) According to the twenty-third aspect of the present invention, there is provided a fiber laser amplifier including: a GaN-based compound laser diode which emits an excitation laser beam; and an optical fiber which has a core doped with $Tb^{3+}$, and amplifies incident light which has a wavelength within a wavelength range of fluorescence generated by a transition from $^5D_4$ to $^7F_5$ when the optical fiber is excited with the excitation laser beam.

Preferably, the fiber laser amplifier according to the twenty-third aspect of the present invention may also have one or any possible combination of the following additional features (i) and (ii).

(i) The fluorescence is in the wavelength range of 530 to 550 nm.
(ii) The core of the optical fiber is doped with no rare-earth ion other than $Tb^{3+}$.

The excitation wavelength of the core of the optical fiber doped with $Tb^{3+}$ is 380 nm.

In addition, in the twelfth to twenty-third aspects of the present invention, the GaN-based compound laser diode may have an active layer made of one of InGaN, InGaNAs, and GaNAs materials.

(XXVI) The advantages of the twelfth to twenty-third aspects of the present invention are as follows.

(i) For similar reasons to those explained in paragraph (VII) (i), in the fiber laser apparatuses and the fiber laser amplifiers according to the twelfth to seventeenth aspects of the present invention, a great portion of the excitation light is absorbed by the optical fiber, and high efficiency and high output power can be achieved.

(ii) For similar reasons to those explained in paragraph (VII) (ii), the fiber laser apparatuses according to the twelfth to seventeenth aspects of the present invention can emit laser light having a wavelength which no laser light capable of being generated by the conventional fiber laser apparatuses has, and the fiber laser amplifiers according to the eighteenth to twenty-third aspects of the present invention can amplify laser light having a wavelength which no laser light capable of being amplified by the conventional fiber laser amplifiers has.

(iii) For the same reasons as those explained in paragraph (VII) (iii), the GaN-based compound laser diodes have a thermal conductivity coefficient of about 130 W/m° C., which is much greater than the thermal conductivity coefficient of the ZnMgSSe-based compound laser diodes, which is about 4 W/m° C. In addition, since the dislocation mobility in the GaN-based compound laser diodes is very low, compared with that in the ZnMgSSe-based compound laser diodes, the COD (catastrophic optical damage) thresholds of the GaN-based compound laser diodes are very high. Therefore, it is easy to obtain GaN-based compound laser diodes having a long lifetime and high output power. Since the fiber laser apparatuses and the fiber laser amplifiers according to the twelfth to twenty-third aspects of the present invention use a GaN-based compound laser diode as an excitation light source, the laser-diode-excited solid-state laser apparatuses have a long lifetime, and can emit or amplify a laser beam with high output power.

(XXVII) In the constructions according to the first to twenty-third aspects of the present invention, the GaN-based compound laser diodes used as an excitation light source may be a single-longitudinal-mode, single-transverse-mode, broad-area, phased-array, or MOPA (master oscillator power amplifier) type high power laser diode. In addition, one or more GaN-based compound laser diodes may be used in the constructions according to the first to twenty-third aspects of the present invention. In this case, the constructions according to the first to seventeenth aspects of the present invention can emit a laser beam with further higher output power, e.g., on the order of 1 W.

DESCRIPTION OF PREFERRED
EMBODIMENTS

Embodiments of the present invention are explained in detail below with reference to drawings.

First Embodiment

Figure 1:
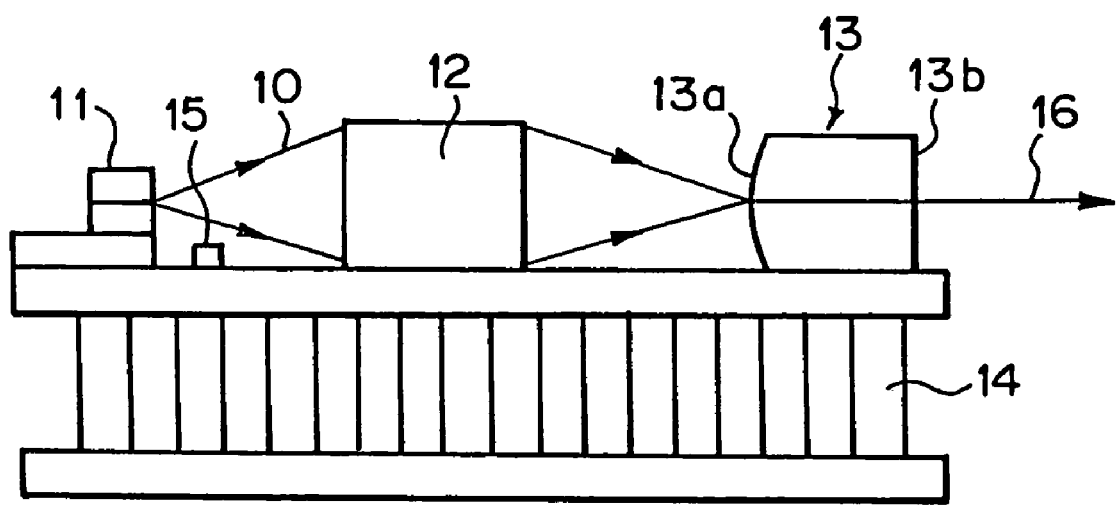
FIG. 1 is a side view illustrating an outline of the construction of a laser-diode-excited solid-state laser apparatus as a first embodiment of the present invention.

The first embodiment of the present invention is explained below. FIG. 1 is a side view illustrating an outline of the construction of a laser-diode-excited solid-state laser apparatus as the first embodiment of the present invention.

The laser-diode-excited solid-state laser apparatus of FIG. 1 comprises a laser diode 11, a condenser lens 12, and a $Ho^{3+}$-doped solid-state crystal 13. The laser diode 11 emits a laser beam 10 as excitation light. The laser beam 10 is a divergent light beam, and the condenser lens 12 condenses the laser beam 10. The $Ho^{3+}$-doped solid-state crystal is an $Y_3Al_5O_{12}$ crystal doped with 1 atomic percent (atm %) of $Ho^{3+}$, which is referred to as Ho:YAG crystal.

The above elements 11 to 13 are fixed on a Peltier element 14, and a thermistor 15 is attached to the Peltier element 14 for detecting temperature. The output of the thermistor 15 is supplied to a temperature control circuit (not shown). Thus, the operation of the Peltier element 14 is controlled by the temperature control circuit based on the output of the thermistor 15 so that the laser diode 11, the condenser lens 12, and the Ho:YAG crystal 13 are maintained at a predetermined temperature.

The laser diode 11 is a broad-area type GaN-based compound laser diode, which oscillates at the wavelength of 420 nm.

In order to generate a laser beam having the wavelength of 550 nm by the transition from $^5S_2$ to $^5I_8$ in the solid-state crystal 13, the backward end surface (light entrance end face) 13a of the solid-state crystal 13 is coated to be highly reflective (HR) at the wavelength of 550 nm and antireflective (AR) at other wavelengths including 750 nm (the wavelength of the fluorescence generated by the transition from $^5S_2$ to $^5I_7$) and 420 nm (the wavelength of the laser beam 10). On the other hand, the forward end surface 13b of the solid-state crystal 13 is coated so as to have a transmittance of 1% (i.e., a reflectance of 99%) at the wavelength of 550 nm.

The laser beam 10 being emitted from the laser diode 11 and having the wavelength of 420 nm enters the solid-state crystal 13 through the backward end surface 13a. In the solid-state crystal 13, $Ho^{3+}$ is excited by the laser beam 10, and fluorescence having the wavelength of 550 nm is generated by the transition from $^5S_2$ to $^5I_8$ in the solid-state crystal 13. The fluorescence having the wavelength of 550 nm resonates between the forward and backward end surfaces 13b and 13a, and causes a laser oscillation. Thus, a green laser beam 16 is generated in the solid-state crystal 13, and output through the forward end surface 13b.

In the laser-diode-excited solid-state laser apparatus as the first embodiment, the applicants have obtained the green laser beam 16 with the output power of 100 mW when the output power of the GaN-based compound laser diode 11 is 300 mW.

Alternatively, the coatings applied to the forward and backward end surfaces 13b and 13a may be arranged so that a laser beam having the wavelength of 750 nm is obtained from the solid-state crystal 13, since the solid-state crystal 13 can generate the fluorescence having the wavelength of 750 nm by the transition from $^5S_2$ to $^5I_7$.

Second Embodiment

The second embodiment of the present invention is explained below. Since the construction of the laser-diode-excited solid-state laser apparatus as the second embodiment of the present invention has the same construction as the first embodiment except for the portions of the construction explained below, the reference numerals in FIG. 1 are also referred to in the following explanations of the second embodiment.

The laser-diode-excited solid-state laser apparatus as the second embodiment is different from the laser-diode-excited solid-state laser apparatus as the first embodiment in the rare-earth ion with which the solid-state crystal 13 is doped and the coatings applied to the forward and backward end surfaces 13b and 13a.

That is, in the second embodiment, the solid-state crystal 13 is doped with 1 atomic percent (atm %) of $Sm^{3+}$ instead of $Ho^{3+}$. In addition, the laser diode 11 used in the second embodiment emits a laser beam having the wavelength of 404 nm. Further, in order to generate a laser beam having the wavelength of 566 nm by the transition from $^4G_{5/2}$ to $^6H_{5/2}$ in the solid-state crystal 13, the backward end surface (light entrance end face) 13a of the solid-state crystal 13 is coated to be highly reflective (HR) at the wavelength of 566 nm and antireflective (AR) at other wavelengths including 615 nm (the wavelength of the fluorescence generated by the transition from $^4G_{5/2}$ to $^6H_{7/2}$), 650 nm (the wavelength of the fluorescence generated by the transition from $^4F_{3/2}$ to $^6H_{11/2}$), and 404 nm (the wavelength of the excitation laser beam 10). On the other hand, the forward end surface 13b of the solid-state crystal 13 is coated so as to have a transmittance of 1% (i.e., a reflectance of 99%) at the wavelength of 566 nm.

In the laser-diode-excited solid-state laser apparatus as the second embodiment, the applicants have obtained a laser beam 16 having the wavelength of 566 nm and the output power of 40 mW when the output power of the GaN-based compound laser diode 11 is 200 mW.

Alternatively, the coatings applied to the forward and backward end surfaces 13b and 13a may be arranged so that a laser beam having a wavelength of 615 or 650 nm is obtained from the $Sm^{3+}$-doped solid-state crystal 13, since the $Sm^{3+}$-doped solid-state crystal 13 can generate the fluorescence having the wavelength of 615 nm by the transition from $^4G_{5/2}$ to $^6H_{7/2}$ and the fluorescence having the wavelength of 650 nm by the transition from $^4F_{3/2}$ to $^6H_{11/2}$.

For example, in the case where the laser beam having the wavelength of 615 nm is oscillated, it is possible to obtain a solid-state laser beam 16 having the output power of 50 mW by using a GaN-based compound laser diode 11 having the output power of 200 mW.

Third Embodiment

The third embodiment of the present invention is explained below. Since the construction of the laser-diode-excited solid-state laser apparatus as the third embodiment of the present invention also has the same construction as the first embodiment except for the portions of the construction explained below, the reference numerals in FIG. 1 are also referred to in the following explanations of the third embodiment.

The laser-diode-excited solid-state laser apparatus as the third embodiment is different from the laser-diode-excited solid-state laser apparatus as the first embodiment in the rare-earth ion with which the solid-state crystal 13 is doped and the coatings applied to the forward and backward end surfaces 13b and 13a.

That is, in the third embodiment, the solid-state crystal 13 is doped with 1 atomic percent (atm %) of $Eu^{3+}$ instead of $Ho^{3+}$. In addition, the laser diode 11 used in the third embodiment emits a laser beam having the wavelength of 394 nm. Further, in order to generate a laser beam having the wavelength of 589 nm by the transition from $^5D_0$ to $^7F_2$ in the solid-state crystal 13, the backward end surface (light entrance end face) 13a of the solid-state crystal 13 is coated to be highly reflective (HR) at the wavelength of 589 nm and antireflective (AR) at other wavelengths including wavelengths of fluorescence generated by the other transitions and the excitation wavelength of 394 nm. On the other hand, the forward end surface 13b of the solid-state crystal 13 is coated so as to have a transmittance of 1% (i.e., a reflectance of 99%) at the wavelength of 589 nm.

In the laser-diode-excited solid-state laser apparatus as the third embodiment, the applicants have obtained a laser beam 16 having the wavelength of 589 nm and the output power of 20 mW when the output power of the GaN-based compound laser diode 11 is 100 mW.

Fourth Embodiment

The fourth embodiment of the present invention is explained below. Since the construction of the laser-diode-excited solid-state laser apparatus as the fourth embodiment of the present invention has the same construction as the first embodiment except for the portions of the construction explained below, the reference numerals in FIG. 1 are also referred to in the following explanations of the fourth embodiment.

The laser-diode-excited solid-state laser apparatus as the fourth embodiment is different from the laser-diode-excited solid-state laser apparatus as the first embodiment in the rare-earth ion with which the solid-state crystal 13 is doped and the coatings applied to the forward and backward end surfaces 13b and 13a.

That is, in the fourth embodiment, the solid-state crystal 13 is doped with 1 atomic percent (atm %) of $Dy^{3+}$ instead of $Ho^{3+}$. In addition, the laser diode 11 used in the fourth embodiment emits a laser beam having the wavelength of 390 nm. Further, in order to generate a laser beam having the wavelength of 572 nm by the transition from $^4F_{9/2}$ to $^6H_{13/2}$ in the solid-state crystal 13, the backward end surface (light entrance end face) 13a of the solid-state crystal 13 is coated to be highly reflective (HR) at the wavelength of 572 nm and antireflective (AR) at other wavelengths including 664 nm (the wavelength of the fluorescence generated by the transition from $^4F_{9/2}$ to $^6H_{11/2}$) and 390 nm (the wavelength of the excitation laser beam 10). On the other hand, the forward end surface 13b of the solid-state crystal 13 is coated so as to have a transmittance of 1% (i.e., a reflectance of 99%) at the wavelength of 572 nm.

In the laser-diode-excited solid-state laser apparatus as the fourth embodiment, the applicants have obtained a laser beam 16 having the wavelength of 572 nm and the output power of 10 mW when the output power of the GaN-based compound laser diode 11 is 100 mW.

Alternatively, the coatings applied to the forward and backward end surfaces 13b and 13a may be arranged so that a laser beam having the wavelength of 664 nm is obtained from the $Dy^{3+}$-doped solid-state crystal 13, since the $Dy^{3+}$-doped solid-state crystal 13 can generate the fluorescence having the wavelength of 664 nm by the transition from $^4F_{9/2}$ to $^6H_{11/2}$. In this case, it is possible to obtain a solid-state laser beam 16 having the output power of 10 mW by using a GaN-based compound laser diode 11 having the output power of 100 mW.

Fifth Embodiment

The fifth embodiment of the present invention is explained below. Since the construction of the laser-diode-excited solid-state laser apparatus as the fifth embodiment of the present invention has the same construction as the first embodiment except for the portions of the construction explained below, the reference numerals in FIG. 1 are also referred to in the following explanations of the fifth embodiment.

The laser-diode-excited solid-state laser apparatus as the fifth embodiment is different from the laser-diode-excited solid-state laser apparatus as the first embodiment in the rare-earth ion with which the solid-state crystal 13 is doped and the coatings applied to the forward and backward end surfaces 13b and 13a.

That is, in the fifth embodiment, the solid-state crystal 13 is doped with 1 atomic percent (atm %) of $Er^{3+}$ instead of $Ho^{3+}$. In addition, the laser diode 11 used in the fifth embodiment emits a laser beam having the wavelength of 406 nm. Further, in order to generate a laser beam having the wavelength of 554 nm by the transition from $^2H_{9/2}$ to $^4I_{13/2}$ in the solid-state crystal 13, the backward end surface (light entrance end face) 13a of the solid-state crystal 13 is coated to be highly reflective (HR) at the wavelength of 554 nm and antireflective (AR) at other wavelengths including 540 nm (the wavelength of the fluorescence generated by the transition from $^4S_{3/2}$ to $^4I_{15/2}$) and 406 nm (the wavelength of the excitation laser beam 10). On the other hand, the forward end surface 13b of the solid-state crystal 13 is coated so as to have a transmittance of 1% (i.e., a reflectance of 99%) at the wavelength of 554 nm.

In the laser-diode-excited solid-state laser apparatus as the fifth embodiment, the applicants have obtained a laser beam 16 having the wavelength of 554 nm and the output power of 30 mW when the output power of the GaN-based compound laser diode 11 is 200 mW.

Alternatively, the coatings applied to the forward and backward end surfaces 13b and 13a may be arranged so that a laser beam having the wavelength of 540 nm is obtained from the $Er^{3+}$-doped solid-state crystal 13, since the $Er^{3+}$-doped solid-state crystal 13 can generate the fluorescence having the wavelength of 540 nm by the transition from $^4S_{3/2}$ to $^4I_{15/2}$.

In addition, the excitation wavelength may be 380 nm instead of 406 nm.

Sixth Embodiment

The sixth embodiment of the present invention is explained below. Since the construction of the laser-diode-excited solid-state laser apparatus as the sixth embodiment of the present invention also has the same construction as the first embodiment except for the portions of the construction explained below, the reference numerals in FIG. 1 are also referred to in the following explanations of the sixth embodiment.

The laser-diode-excited solid-state laser apparatus as the sixth embodiment is different from the laser-diode-excited solid-state laser apparatus as the first embodiment in the rare-earth ion with which the solid-state crystal 13 is doped and the coatings applied to the forward and backward end surfaces 13b and 13a.

That is, in the sixth embodiment, the solid-state crystal 13 is doped with 1 atomic percent (atm %) of $Tb^{3+}$ instead of $Ho^{3+}$. In addition, the laser diode 11 used in the sixth embodiment emits a laser beam having the wavelength of 380 nm. Further, in order to generate a laser beam having the wavelength of 540 nm by the transition from $^5D_4$ to $^7F_5$ in the solid-state crystal 13, the backward end surface (light entrance end face) 13a of the solid-state crystal 13 is coated to be highly reflective (HR) at the wavelength of 540 nm and antireflective (AR) at other wavelengths including the wavelengths of the fluorescence generated by the other transitions and the excitation wavelength of 380 nm. On the other hand, the forward end surface 13b of the solid-state crystal 13 is coated so as to have a transmittance of 1% (i.e., a reflectance of 99%) at the wavelength of 540 nm.

In the laser-diode-excited solid-state laser apparatus as the sixth embodiment, the applicants have obtained a laser beam 16 having the wavelength of 540 nm and the output power of 10 mW when the output power of the GaN-based compound laser diode 11 is 100 mW.

Variations of First to Sixth Embodiments

Although the solid-state laser crystal 13 in the constructions of the first to sixth embodiments are an $Y_3Al_5O_{12}$ (YAG) crystal, alternatively, $LiYF_4$ (YLF), $YVO_4$, $GdVO_4$, $BaY_2F_8$, $Ba(Y,Yb)_2F_8$, $LaF_3$, $Ca(NbO_3)_2$, $CaWO_4$, $SrMoO_4$, $YAlO_3$ (YAP), $Y_2SiO_5$, $YP_5O_{14}$, $LaP_5O_{14}$, $LuAlO_3$, $LaCl_3$, $LaBr_3$, $PrBr_3$, or the like may be used.

The active layers of the laser diodes used as excitation light sources in the constructions of the first to sixth embodiments can be made of an InGaN-based, InGaNAs-based, or GaNAs-based compound material. In particular, when an absorption band of a solid-state laser crystal is located on the longer wavelength side of the output wavelength of the laser diode, it is preferable to use the InGaNAs-based or GaNAs-based compound material, since the wavelength of the laser oscillation in the InGaNAs-based or GaNAs-based compound laser diode can be lengthened more easily than that in the InGaN-based compound laser diode. That is, the absorption efficiency in the InGaNAs-based or GaNAs-based compound laser diode can be enhanced more easily than that in the InGaN-based compound laser diode.

Seventh Embodiment

Figure 2:
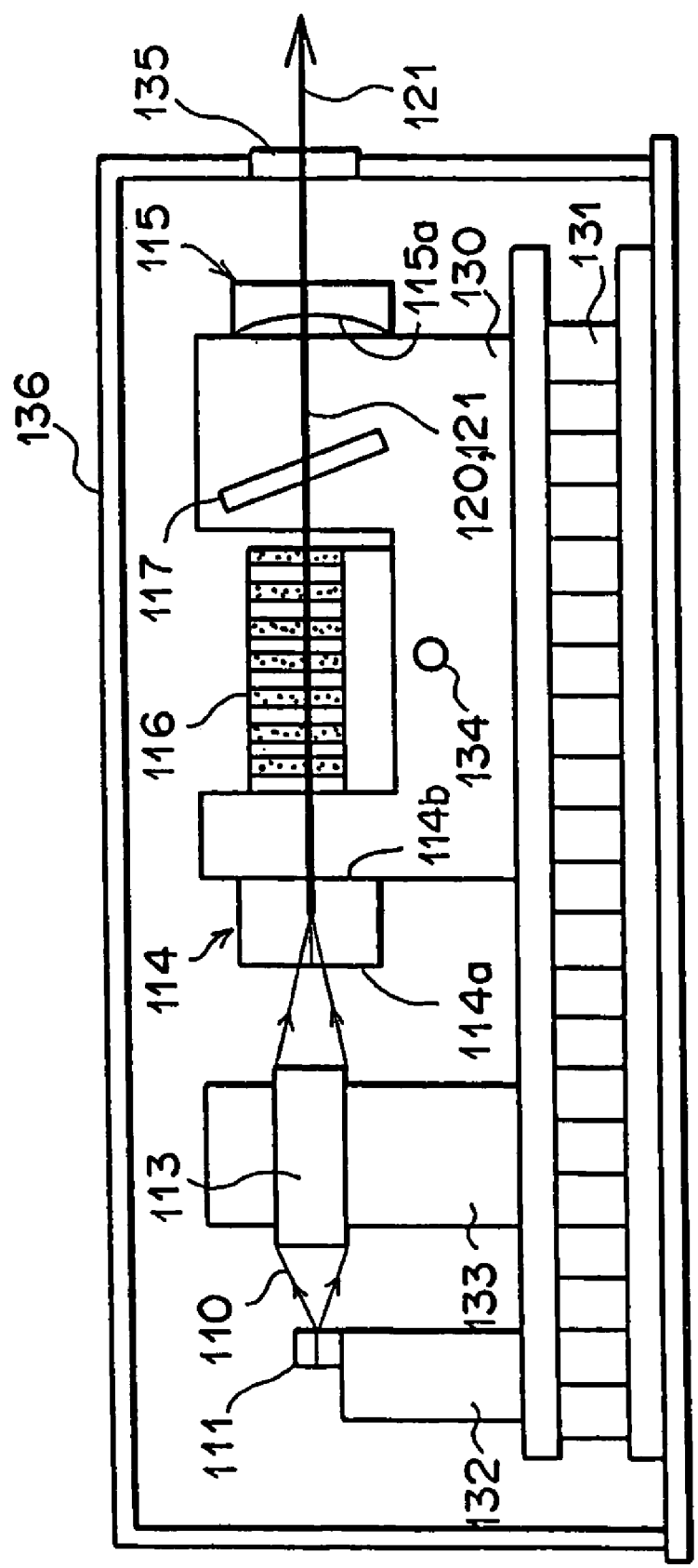
FIG. 2 is a side view illustrating an outline of the construction of a laser-diode-excited solid-state laser apparatus as a seventh embodiment of the present invention.

FIG. 2 is a side view illustrating an outline of the construction of a laser-diode-excited solid-state laser apparatus as the seventh embodiment of the present invention.

The laser-diode-excited solid-state laser apparatus of FIG. 2 comprises a laser diode 111, a condenser lens 113, a solid-state laser medium 114, a resonator mirror 115, an optical wavelength conversion element 116, and an etalon 117. The laser diode 111 emits a laser beam 110 as excitation light, where the laser beam 110 is a divergent light beam. The condenser lens 113 is realized by, for example, an index distribution type lens, and condenses the laser beam 110. The solid-state laser medium 114 is an $Y_3Al_5O_{12}$ crystal doped with 1 atomic percent (atm %) of $Ho^{3+}$, i.e., a Ho:YAG crystal. The resonator mirror 115 is arranged on the forward side (i.e., on the right side in FIG. 2) of the Ho:YAG crystal 114. The optical wavelength conversion element 116 and the etalon 117 are arranged between the Ho:YAG crystal 114 and the resonator mirror 115.

The above elements 114 to 117 are arranged on a common mount 130, which is made of, for example, copper. The mount 130 is fixed on a Peltier element 131, which constitutes a temperature adjustment means. The laser diode 111 and the condenser lens 113 are respectively arranged on mounts 132 and 133, which are made of, for example, copper. The mounts 132 and 133 are also fixed on the Peltier element 131. The Peltier element 131 is contained in a sealed case 136, which has a light exit window 135.

In addition, a thermistor 134 is attached to the mount 130. The operation of the Peltier element 131 is controlled by a temperature control circuit (not shown) based on a temperature detection signal which is output from the thermistor 134, so that the laser diode 111 and all of the elements constituting a solid-state laser resonator are maintained at a predetermined common temperature, where the solid-state laser resonator is formed by the Ho:YAG crystal 114 and the resonator mirror 115 as explained later.

The optical wavelength conversion element 116 is produced by forming a periodic domain-inverted structure in a MgO-doped $LiNbO_3$ crystal, which is a nonlinear optical material. In this example, the period of the periodic domain-inverted structure is 2.0 micrometers, which is the first order period with respect to the wavelength (750 nm) of the fundamental harmonic and the wavelength (375 nm) of the second harmonic. The etalon 117 has a function of a wavelength selection element, and is provided for realizing oscillation of the solid-state laser in a single longitudinal mode and reducing noise.

The laser diode 111 in the construction of FIG. 2 is a broad-area type laser diode, which has an InGaN active layer and oscillates at the wavelength of 420 nm.

The backward end surface 114a of the Ho:YAG crystal 114 is a light entrance surface, and is coated so as to have the following transmittance and reflectances. That is, the transmittance of the backward end surface 114a at the wavelength of 420 nm is 80% or higher, so that light having the wavelength of 420 nm efficiently transmits through the backward end surface 114a. In addition, the reflectance of the backward end surface 114a at the wavelength of 750 nm is high, where the wavelength of 750 nm corresponds to one of the oscillation peaks of $Ho^{3+}$. For example, the reflectance of the backward end surface 114a at the wavelength of 750 nm is 99% or higher, and preferably 99.9% or higher. Further, the reflectances of the backward end surface 114a at the wavelengths of the other oscillation peaks of $Ho^{3+}$ (i.e., at the wavelengths of 550 nm, 980 nm, 1,010 nm, and 1,210 nm) are low. For example, the reflectances at the wavelengths of 550 nm, 980 nm, 1,010 nm, and 1,210 nm are 60% or lower, and preferably 30% or lower.

On the other hand, the forward end surface 114b of the Ho:YAG crystal 114 is coated so as to have a low reflectance (e.g., 0.2% or lower) at the wavelength of 750 nm (the wavelength of the fundamental harmonic) and a high reflectance (e.g., 95% or higher) at the wavelength of 375 nm (the wavelength of the second harmonic).

The mirror surface 115a of the resonator mirror 115 is coated so as to have a high reflectance (e.g., 99% or higher, and preferably 99.9% or higher) at the wavelength of 750 nm, a transmittance of 95% at the wavelength of 375 nm, and low reflectances (e.g., 60% or lower, and preferably 30% or lower) at the wavelengths of the other oscillation peaks including the wavelengths of 550 nm, 980 nm, 1,010 nm, and 1,210 nm.

The laser beam 110 emitted from the laser diode 111 has the wavelength of 420 nm, and enters the Ho:YAG crystal 114 through the backward end surface 114a. Since $Ho^{3+}$ in the Ho:YAG crystal 114 is excited by the laser beam 110, the Ho:YAG crystal 114 generates light having the wavelength of 750 nm by the transition from $^5S_2$ to $^5I_7$. Then, laser oscillation at the wavelength of 750 nm occurs in a resonator which is formed by the backward end surface 114a of the Ho:YAG crystal 114 and the mirror surface 115a of the resonator mirror 115, and a solid-state laser beam 120 having the wavelength of 750 nm is generated. The solid-state laser beam 120 enters the optical wavelength conversion element 116, and is converted to a second harmonic 121 having the wavelength of 375 nm, which is one-half of the wavelength of the solid-state laser beam 120.

Since the mirror surface 115a of the resonator mirror 115 is coated as described before, only the second harmonic 121 exits through the resonator mirror 115. Thus, the second harmonic 121 exits from the sealed case 136 through the light exit window 135.

Since, in the laser-diode-excited solid-state laser apparatus as the seventh embodiment of the present invention, the Ho:YAG crystal 114 is excited with the InGaN laser diode, the efficiency and the output power are enhanced for the reason explained before. Actually, the applicants have obtained the second harmonic 121 with the output power of 40 mW when the output power of the laser diode 111 is 300 mW.

Although the operation explained above corresponds to the so-called continuous wave (CW) operation, the efficiency of the wavelength conversion can be enhanced by inserting a Q switch element into the resonator. In this case, the laser-diode-excited solid-state laser apparatus operates in a pulse mode. Alternatively, pulsed ultraviolet light can be obtained with high efficiency and high output power by driving the excitation laser diode in a pulse mode since the COD (catastrophic optical damage) thresholds of the GaN-based compound laser diodes are high.

Further, the solid-state crystal 114 can generate a solid-state laser beam having the wavelength of 550 nm by the transition from $^5S_2$ to $^5I_8$. Therefore, when this solid-state laser beam is converted into a second harmonic by using the optical wavelength conversion element 116, it is possible to obtain ultraviolet light having the wavelength of 275 nm with a high intensity.

Eighth Embodiment

The construction of the laser-diode-excited solid-state laser apparatus as the eighth embodiment of the present invention also has the same construction as the seventh embodiment except for the following portions of the construction.

In the eighth embodiment, the solid-state laser crystal 114 is doped with $Sm^{3+}$ instead of $Ho^{3+}$, and the laser beam 110 emitted from the laser diode 111 has a wavelength of 404 nm, so that the solid-state laser crystal 114 generates fluorescence having a wavelength of about 566, 615, or 650 nm. In addition, the coatings applied to the backward end surface 114a and the forward end surface 114b of the solid-state laser crystal 114 and the mirror surface 115a of the resonator mirror 115 are arranged so that a solid-state laser beam having the wavelength of about 566, 615, or 650 nm is generated in the resonator, a second harmonic 121 having the wavelength of about 283, 308, or 325 nm is generated by the optical wavelength conversion element 116, and ultraviolet light having the wavelength of about 283, 308, or 325 nm is output through the resonator mirror 115.

In the case where the $Sm^{3+}$-doped solid-state laser crystal 114 is used, as well as the case where the $Ho^{3+}$-doped solid-state laser crystal 114 is used, particularly high output power can be obtained.

Ninth Embodiment

The construction of the laser-diode-excited solid-state laser apparatus as the ninth embodiment of the present invention also has the same construction as the seventh embodiment except for the following portions of the construction.

In the ninth embodiment, the solid-state laser crystal 114 is doped with $Eu^{3+}$ instead of $Ho^{3+}$, and the laser beam 110 emitted from the laser diode 111 has a wavelength of 394 nm, so that the solid-state laser crystal 114 generates fluorescence having the wavelength of about 589 nm. In addition, the coatings applied to the backward end surface 114a and the forward end surface 114b of the solid-state laser crystal 114 and the mirror surface 115a of the resonator mirror 115 are arranged so that a solid-state laser beam having the wavelength of about 589 nm is generated in the resonator, a second harmonic 121 having the wavelength of about 295 nm is generated by the optical wavelength conversion element 116, and ultraviolet light having the wavelength of about 295 nm is output through the resonator mirror 115.

Tenth Embodiment

The construction of the laser-diode-excited solid-state laser apparatus as the tenth embodiment of the present invention also has the same construction as the seventh embodiment except for the following portions of the construction.

In the tenth embodiment, the solid-state laser crystal 114 is doped with $Dy^{3+}$ instead of $Ho^{3+}$, and the laser beam 110 emitted from the laser diode 111 has a wavelength of 390 nm, so that the solid-state laser crystal 114 generates fluorescence having a wavelength of about 572 or 664 nm. In addition, the coatings applied to the backward end surface 114a and the forward end surface 114b of the solid-state laser crystal 114 and the mirror surface 115a of the resonator mirror 115 are arranged so that a solid-state laser beam having the wavelength of about 572 or 664 nm is generated in the resonator, a second harmonic 121 having the wavelength of about 286 or 332 nm is generated by the optical wavelength conversion element 116, and ultraviolet light having the wavelength of about 286 or 332 nm is output through the resonator mirror 115.

In the case where the $Dy^{3+}$-doped solid-state laser crystal 114 is used, and the solid-state laser beam having the wavelength of 664 nm is generated, particularly high output power can be obtained.

Eleventh Embodiment

The construction of the laser-diode-excited solid-state laser apparatus as the eleventh embodiment of the present invention also has the same construction as the seventh embodiment except for the following portions of the construction.

In the eleventh embodiment, the solid-state laser crystal 114 is doped with $Er^{3+}$ instead of $Ho^{3+}$, and the laser beam 110 emitted from the laser diode 111 has a wavelength of 406 or 380 nm, so that the solid-state laser crystal 114 generates fluorescence having a wavelength of about 540 or 554 nm. In addition, the coatings applied to the backward end surface 114a and the forward end surface 114b of the solid-state laser crystal 114 and the mirror surface 115a of the resonator mirror 115 are arranged so that a solid-state laser beam having the wavelength of about 540 or 554 nm is generated in the resonator, a second harmonic 121 having the wavelength of about 270 or 277 nm is generated by the optical wavelength conversion element 116, and ultraviolet light having the wavelength of about 270 or 277 nm is output through the resonator mirror 115.

Variations of Seventh to Eleventh Embodiments

Although the active layers of the laser diodes used as excitation light sources in the constructions of the seventh to eleventh embodiments are made of InGaN, alternatively, the active layers of the laser diodes may be made of an InGaNAs-based or GaNAs-based compound material.

Although the solid-state laser crystal 114 in the constructions of the seventh to eleventh embodiments are an $Y_3Al_5O_{12}$ (YAG) crystal, alternatively, $Bay_2F_8$, $Ba(Y,Yb)_2F_8$, $LaF_3$, $Ca(NbO_3)_2$, $CaWO_4$, $SrMoO_4$, $YAlO_3$ (YAP), $LiYF_4$ (YLF), $Y_2SiO_5$, $YP_5O_{14}$, $LaP_5O_{14}$, $LuAlO_3$, $LaCl_3$, $LaBr_3$, $PrBr_3$, or the like may be used.

The period of the periodic domain-inverted structure in the optical wavelength conversion element 116 may not be necessarily the first order period with respect to the wavelength of the fundamental harmonic. Alternatively, the second or third order period may be used. For example, the third order period with respect to the wavelength of 750 nm is 6.0 micrometers.

In addition, the optical wavelength conversion element 116 may not be a type which has the periodic domain-inverted structure. Alternatively, the optical wavelength conversion element 116 may be a type which is made of B—$BaBO_3$, LBO, CLBO, GdYCOB, YCOB, or the like.

Further, the excitation laser diodes 111 may not be the broad-area type. Alternatively, the laser diodes 111 may be a type which includes a MOPA (master oscillator power amplifier) or α-DFB (distributed feedback) structure.

Twelfth Embodiment

Figure 3:
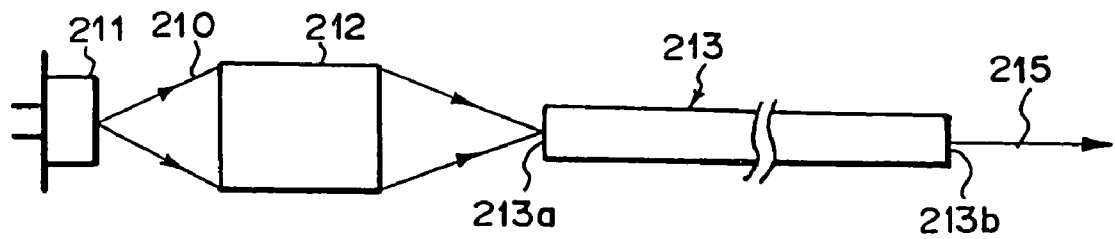
FIG. 3 is a side view illustrating an outline of the construction of a fiber laser apparatus as a twelfth embodiment of the present invention.

FIG. 3 is a side view illustrating an outline of the construction of a fiber laser apparatus as the twelfth embodiment of the present invention.

The fiber laser apparatus of FIG. 3 comprises a laser diode 211, a condenser lens 212, and an optical fiber 213. The laser diode 211 emits a laser beam 210 as excitation light, where the laser beam 210 is a divergent light beam. The condenser lens 212 condenses the laser beam 210. The optical fiber 213 has a core 220 which is doped with $Ho^{3+}$.

The laser diode 211 in the construction of FIG. 3 is a -broad-area type laser diode, which has an active layer made of a GaN-based compound material, and oscillates at the wavelength of 420 nm.

Figure 4:
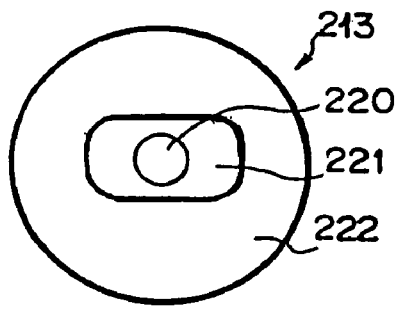
FIG. 4 is a cross-sectional view of an optical fiber used in the fiber laser apparatus of FIG. 3.

FIG. 4 shows a cross section of the optical fiber 213 used in the fiber laser apparatus of FIG. 3. As illustrated in FIG. 4, the optical fiber 213 comprises the core 220 and first and second claddings 221 and 222. The first cladding 221 is arranged around the core 220, and the second cladding 222 is arranged around the first cladding 221. The cross-sectional shape of each of the core 220 and the second cladding 222 is a true circle, and the cross-sectional shape of the first cladding 221 is nearly a rectangle.

The core 220 is made of a zirconium-based fluoride glass, e.g., ZBLANP ($ZrF_4$—$BaF_2$—$LaF_3$—$AlF_3$—$AlF_3$—$NaF$—$PbF_2$), and doped with 1 atomic percent (atm %) of $Ho^{3+}$. The first cladding 221 is made of, for example, ZBLAN ($ZrF_4$—$BaF_2$—$LaF_3$—$AlF_3$—$NaF$), and the second cladding 222 is made of, for example, a polymer. Alternatively, the core 220 may be made of ZBLAN or indium-gallium-based fluoride glass. For example, the core 220 may be made of IGPZCL, i.e., ($InF_3$—$GaF_3$—$LaF_3$)—($PbF_2$—$ZnF_2$)—$CdF$, or the like.

The laser beam 210 condensed by the condenser lens 212 enters the first cladding 221 of the optical fiber 213, and propagates through the first cladding 221 in a guided mode. That, is, the first cladding 221 behaves as a core for the laser beam 210. During the propagation, the laser beam 210 also passes through the core 220. In the core 220, $Ho^{3+}$ is excited by the laser beam 210, so that fluorescence having the wavelength of 550 nm is generated by the transition from $^5S_2$ to $^5I_8$. The fluorescence propagates through the core 220 in a guided mode.

In addition, the core 220 made of ZBLANP can also generate other fluorescence such as the fluorescence having the wavelength of 750 nm, which is generated by the transition from $^5S_2$ to $^5I_7$. Therefore, the light entrance end surface 213a of the optical fiber 213 is coated to be highly reflective (HR) at the wavelength of 550 nm, and antireflective (AR) at the excitation wavelength of 420 nm and the wavelengths of the fluorescence other than 550 nm. In addition, the light exit end surface 213b of the optical fiber 213 is coated so as to transmit only 1% of the light having the wavelength of 550 nm.

In the above configuration, the above fluorescence having the wavelength of 550 nm resonates between the light entrance end surface 213a and the light exit end surface 213b of the optical fiber 213, i.e., laser oscillation occurs at the wavelength of 550 nm. Thus, a green laser beam 215 having the wavelength of 550 nm is generated in the optical fiber 213, and exits from the light exit end surface 213b of the optical fiber 213 to the forward side of the fiber laser apparatus of FIG. 3.

In this example, the laser beam 215 propagates through the core 220 in a single mode, and the laser beam 210 propagates through the first cladding 221 in multiple modes. Therefore, it is possible to use a high-power, broad-area type laser diode as the excitation light source, and input the laser beam 210 from the high-power, broad-area type laser diode into the optical fiber 213 with high coupling efficiency.

In addition, since the cross-sectional shape of the first cladding 221 is nearly a rectangle, the laser beam 210 propagates through irregular reflection paths within the first cladding 221, and therefore the probability of entrance of the laser beam 210 into the core 220 is enhanced.

Further, since the wavelength 420 nm of the laser beam 210 is within the wavelength range in which the output power of the GaN-based compound laser diodes is enhanced, the amount of the laser beam 210 absorbed by the optical fiber 213 becomes great, and high efficiency and high output power can be achieved. Actually, the applicants have obtained the green laser beam 215 with the output power of 150 mW when the output power of the laser diode 211 is 300 mW, and the length of the optical fiber 213 is 1 m.

Furthermore, the $Ho^{3+}$-doped core 220 of the optical fiber 213 can generate the fluorescence having the wavelength of 750 nm by the transition from $^5S_2$ to $^5I_7$. Therefore, when the coatings applied to the light entrance end surface 213a and the light exit end surface 213b of the optical fiber 213 are appropriately arranged, the fiber laser apparatus of FIG. 3 can emit a laser beam having the wavelength of 750 nm.

Thirteenth Embodiment

The thirteenth embodiment of the present invention is explained below. Since the construction of the fiber laser apparatus as the thirteenth embodiment of the present invention has the same construction as the twelfth embodiment except for the portions of the construction explained below, the reference numerals in FIG. 3 are also referred to in the following explanations of the thirteenth embodiment.

The fiber laser apparatus as the thirteenth embodiment is different from the fiber laser apparatus as the twelfth embodiment in the rare-earth ion with which the core 220 of the optical fiber 213 is doped and the coatings applied to the light entrance end surface 213a and the light exit end surface 213b of the optical fiber 213.

That is, in the thirteenth embodiment, the core 220 of the optical fiber 213 is doped with 1 atomic percent (atm %) of $Sm^{3+}$ instead of $Ho^{3+}$. In addition, the laser diode 211 used in the thirteenth embodiment emits a laser beam having the wavelength of 404 nm. Further, in order to generate a laser beam having the wavelength of 566 nm by the transition from $^4G_{5/2}$ to $^6H_{5/2}$ in the core 220 of the optical fiber 213, the light entrance end surface 213a of the optical fiber 213 is coated to be highly reflective (HR) at the wavelength of 566 nm and antireflective (AR) at other wavelengths including 615 nm (the wavelength of the fluorescence generated by the transition from $^4G_{5/2}$ to $^6H_{7/2}$), 650 nm (the wavelength of the fluorescence generated by the transition from $^4F_{3/2}$ to $^6H_{11/2}$), and 404 nm (the wavelength of the excitation laser beam 210). On the other hand, the light exit end surface 213b of the optical fiber 213 is coated so as to have a transmittance of 1% (i.e., a reflectance of 99%) at the wavelength of 566 nm.

In the fiber laser apparatus as the thirteenth embodiment, the applicants have obtained a laser beam 215 having the wavelength of 566 nm and the output power of 110 mW when the output power of the GaN-based compound laser diode 211 is 200 mW, and the length of the optical fiber 213 is 1 m.

Alternatively, the coatings applied to the light entrance end surface 213a and the light exit end surface 213b of the optical fiber 213 may be arranged so that a laser beam having a wavelength of 615 or 650 nm is generated in the optical fiber 213, since the $Sm^{3+}$-doped core 220 of the optical fiber 213 can generate the fluorescence having the wavelength of 615 nm by the transition from $^4G_{5/2}$ to $^6H_{7/2}$ and the fluorescence having the wavelength of 650 nm by the transition from $^4F_{3/2}$ to $^6H_{11/2}$.

Fourteenth Embodiment

The fourteenth embodiment of the present invention is explained below. Since the construction of the fiber laser apparatus as the fourteenth embodiment of the present invention also has the same construction as the twelfth embodiment except for the portions of the construction explained below, the reference numerals in FIG. 3 are also referred to in the following explanations of the fourteenth embodiment.

The fiber laser apparatus as the fourteenth embodiment is different from the fiber laser apparatus as the twelfth embodiment in the rare-earth ion with which the core 220 of the optical fiber 213 is doped and the coatings applied to the light entrance end surface 213a and the light exit end surface 213b of the optical fiber 213.

That is, in the fourteenth embodiment, the core 220 of the optical fiber 213 is doped with 1 atomic percent (atm %) of $Eu^{3+}$ instead of $Ho^{3+}$. In addition, the laser diode 211 used in the fourteenth embodiment emits a laser beam having the wavelength of 394 nm. Further, in order to generate a laser beam having the wavelength of 589 nm by the transition from $^5D_0$ to $^7F_2$ in the core 220 of the optical fiber 213, the light entrance end surface 213a of the optical fiber 213 is coated to be highly reflective (HR) at the wavelength of 589 nm and antireflective (AR) at other wavelengths including the wavelengths of the fluorescence generated by the other transitions and the excitation wavelength of 394 nm. On the other hand, the light exit end surface 213b of the optical fiber 213 is coated so as to have a transmittance of 1% (i.e., a reflectance of 99%) at the wavelength of 589 nm.

In the fiber laser apparatus as the fourteenth embodiment, the applicants have obtained a laser beam 215 having the wavelength of 589 nm and the output power of 40 mW when the output power of the GaN-based compound laser diode 211 is 100 mW, and the length of the optical fiber 213 is 1 m.

Fifteenth Embodiment

The fifteenth embodiment of the present invention is explained below. Since the construction of the fiber laser apparatus as the fifteenth embodiment of the present invention has the same construction as the twelfth embodiment except for the portions of the construction explained below, the reference numerals in FIG. 3 are also referred to in the following explanations of the fifteenth embodiment.

The fiber laser apparatus as the fifteenth embodiment is different from the fiber laser apparatus as the twelfth embodiment in the rare-earth ion with which the core 220 of the optical fiber 213 is doped and the coatings applied to the light entrance end surface 213a and the light exit end surface 213b of the optical fiber 213.

That is, in the fifteenth embodiment, the core 220 of the optical fiber 213 is doped with 1 atomic percent (atm %) of $Dy^{3+}$ instead of $Ho^{3+}$. In addition, the laser diode 211 used in the fifteenth embodiment emits a laser beam having the wavelength of 390 nm. Further, in order to generate a laser beam having the wavelength of 572 nm by the transition from $^4F_{9/2}$ to $^6H_{13/2}$ in the core 220 of the optical fiber 213, the light entrance end surface 213a of the optical fiber 213 is coated to be highly reflective (HR) at the wavelength of 572 nm and antireflective (AR) at other wavelengths including 664 nm (the wavelength of the fluorescence generated by the transition from $^4F_{9/2}$ to $^6H_{11/2}$) and 390 nm (the wavelength of the excitation laser beam 210). On the other hand, the light exit end surface 213b of the optical fiber 213 is coated so as to have a transmittance of 1% (i.e., a reflectance of 99%) at the wavelength of 572 nm.

In the fiber laser apparatus as the fifteenth embodiment, the applicants have obtained a laser beam 215 having the wavelength of 572 nm and the output power of 50 mW when the output power of the GaN-based compound laser diode 211 is 100 mW, and the length of the optical fiber 213 is 1 m.

Alternatively, the coatings applied to the light entrance end surface 213a and the light exit end surface 213b of the optical fiber 213 may be arranged so that a laser beam having the wavelength of 664 nm is generated in the optical fiber 213, since the $Dy^{3+}$-doped core 220 of the optical fiber 213 can generate the fluorescence having the wavelength of 664 nm by the transition from $^4F_{9/2}$ to $^6H_{11/2}$.

Sixteenth Embodiment

The sixteenth embodiment of the present invention is explained below. Since the construction of the fiber laser apparatus as the sixteenth embodiment of the present invention has the same construction as the twelfth embodiment except for the portions of the construction explained below, the reference numerals in FIG. 3 are also referred to in the following explanations of the sixteenth embodiment.

The fiber laser apparatus as the sixteenth embodiment is different from the fiber laser apparatus as the twelfth embodiment in the rare-earth ion with which the core 220 of the optical fiber 213 is doped and the coatings applied to the light entrance end surface 213a and the light exit end surface 213b of the optical fiber 213.

That is, in the sixteenth embodiment, the core 220 of the optical fiber 213 is doped with 1 atomic percent (atm %) of $Er^{3+}$ instead of $Ho^{3+}$. In addition, the laser diode 211 used in the sixteenth embodiment emits a laser beam having the wavelength of 406 nm. Further, in order to generate a laser beam having the wavelength of 554 nm by the transition from $^2H_{9/2}$ to $^4I_{13/2}$ in the core 220 of the optical fiber 213, the light entrance end surface 213a of the optical fiber 213 is coated to be highly reflective (HR) at the wavelength of 554 nm and antireflective (AR) at other wavelengths including 540 nm (the wavelength of the fluorescence generated by the transition from $^4S_{3/2}$ to $^4I_{15/2}$) and 406 nm (the wavelength of the excitation laser beam 210). On the other hand, the light exit end surface 213b of the optical fiber 213 is coated so as to have a transmittance of 1% (i.e., a reflectance of 99%) at the wavelength of 554 nm.

In the fiber laser apparatus as the sixteenth embodiment, the applicants have obtained a laser beam 215 having the wavelength of 554 nm and the output power of 120 mW when the output power of the GaN-based compound laser diode 211 is 200 mW, and the length of the optical fiber 213 is 1 m.

Alternatively, the coatings applied to the light entrance end surface 213a and the light exit end surface 213b of the optical fiber 213 may be arranged so that a laser beam having the wavelength of 540 nm is generated in the optical fiber 213, since the $Er^{3+}$-doped core 220 of the optical fiber 213 can generate the fluorescence having the wavelength of 540 nm by the transition from $^4S_{3/2}$ to $^4I_{15/2}$.

In addition, the excitation wavelength may be 380 nm instead of 406 nm.

Seventeenth Embodiment

The seventeenth embodiment of the present invention is explained below. Since the construction of the fiber laser apparatus as the seventeenth embodiment of the present invention also has the same construction as the twelfth embodiment except for the portions of the construction explained below, the reference numerals in FIG. 3 are also referred to in the following explanations of the seventeenth embodiment.

The fiber laser apparatus as the seventeenth embodiment is different from the fiber laser apparatus as the twelfth embodiment in the rare-earth ion with which the core 220 of the optical fiber 213 is doped and the coatings applied to the light entrance end surface 213a and the light exit end surface 213b of the optical fiber 213.

That is, in the seventeenth embodiment, the core 220 of the optical fiber 213 is doped with 1 atomic percent (atm %) of $Tb^{3+}$ instead of $Ho^{3+}$. In addition, the laser diode 211 used in the seventeenth embodiment emits a laser beam having the wavelength of 380 nm. Further, in order to generate a laser beam having the wavelength of 540 nm by the transition from $^5D_4$ to $^7F_5$ in the core 220 of the optical fiber 213, the light entrance end surface 213a of the optical fiber 213 is coated to be highly reflective (HR) at the wavelength of 540 nm and antireflective (AR) at other wavelengths including the wavelengths of the fluorescence generated by the other transitions and the excitation wavelength of 380 nm. On the other hand, the light exit end surface 213b of the optical fiber 213 is coated so as to have a transmittance of 1% (i.e., a reflectance of 99%) at the wavelength of 540 nm.

In the fiber laser apparatus as the seventeenth embodiment, the applicants have obtained a laser beam 215 having the wavelength of 540 nm and the output power of 30 mW when the output power of the GaN-based compound laser diode 211 is 100 mW, and the length of the optical fiber 213 is 1 m.

Eighteenth Embodiment

Figure 5:
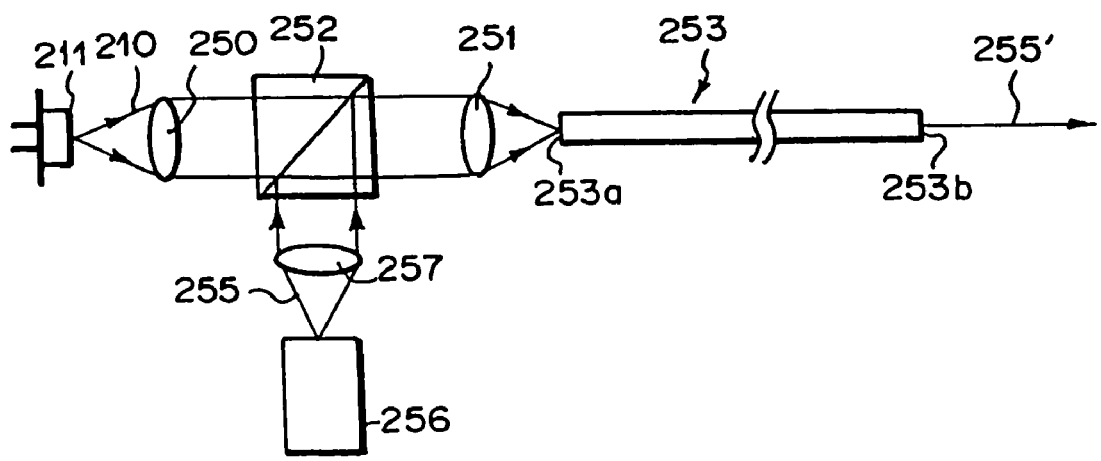
FIG. 5 is a side view illustrating an outline of the construction of a fiber laser amplifier as an eighteenth embodiment of the present invention.

FIG. 5 is a side view illustrating an outline of the construction of a fiber laser amplifier as the eighteenth embodiment of the present invention. In FIG. 5, elements having the same reference numbers as FIG. 3 have the same functions as the corresponding elements in FIG. 3.

The fiber laser amplifier of FIG. 5 comprises a laser diode 211, a collimator lens 250, a condenser lens 251, a beam splitter 252, an optical fiber 253, an SHG (second harmonic generation) laser unit 256, and another collimator lens 257. The laser diode 211 emits a laser beam 210 having the wavelength of 420 nm as excitation light, where the laser beam 210 is a divergent light beam. The collimator lens 250 collimates the laser beam 210. The beam splitter 252 is arranged between the collimator lens 250 and the condenser lens 251, and the laser beam 210 collimated by the collimator lens 250 passes through the beam splitter 252. The condenser lens 251 condenses the collimated laser beam 210, and the condensed laser beam 210 enters the optical fiber 253, which has a $Ho^{3+}$-doped core.

The SHG laser unit 256 is provided for emitting a laser beam 255 having the wavelength of 550 nm. Although not shown, the SHG laser unit 256 includes a DBR (distributed Bragg reflection) type laser diode and an optical waveguide. The DBR type laser diode is provided as a light source of a fundamental wave, and emits a laser beam having the wavelength of 1,100 nm. The optical waveguide is provided as a wavelength conversion element, which is made of a nonlinear optical material and has periodic domain-inverted structure. In the SHG laser unit 256, the wavelength of the laser beam emitted from the DBR type laser diode is reduced in half by the optical waveguide, and the laser beam 255 having the wavelength of 550 nm is generated.

The laser beam 255 is collimated by the collimator lens 257, and the collimated laser beam 255 enters the beam splitter 252, in which the collimated laser beam 255 is reflected toward the condenser lens 251. Then, the collimated and reflected laser beam 255 is condensed by the condenser lens 251, and enters the optical fiber 253 together with the laser beam 210 from the laser diode 211.

The optical fiber 253 has basically the same construction as the optical fiber 213 in the twelfth embodiment, except that the light entrance end surface 253a and the light exit end surface 253b of the optical fiber 253 are coated to be antireflective (AR) at the above wavelengths of 420 nm and 550 nm.

The laser beam 210 excites $Ho^{3+}$ in the core of the optical fiber 253, and fluorescence having the wavelength of 550 nm is generated by the excitation of $Ho^{3+}$, in the same manner as the twelfth embodiment. Since the wavelength of the above fluorescence is the same as the wavelength of the laser beam 255 from the SHG laser unit 256, the laser beam 255 is amplified in the optical fiber 253 by receiving the energy of the fluorescence, and the amplified laser beam 255' is output through the light exit end surface 253b to the forward side of the fiber laser amplifier of FIG. 5.

Actually, the applicants have obtained the amplified laser beam 255' with the output power of 60 mW when the output power of the SHG laser unit 256 is 1 mW.

In addition, when a function of modulation of the laser beam 255 is provided to the DBR type laser diode in the SHG laser unit 256, it is possible to modulate the laser beam 255'.

Further, the $Ho^{3+}$-doped core of the optical fiber 253 can generate the fluorescence having the wavelength of 750 nm by the transition from $^5S_2$ to $^5I_7$. Therefore, when the coatings applied to the light entrance end surface 253a and the light exit end surface 253b of the optical fiber 253 are appropriately arranged, the fiber laser amplifier as the eighteenth embodiment of the present invention can amplify a laser beam having the wavelength of 750 nm.

Nineteenth Embodiment

The nineteenth embodiment of the present invention is explained below. Since the construction of the fiber laser amplifier as the nineteenth embodiment of the present invention has the same construction as the eighteenth embodiment except for the portions of the construction explained below, the reference numerals in FIG. 5 are also referred to in the following explanations of the nineteenth embodiment.

The fiber laser amplifier as the nineteenth embodiment is different from the fiber laser amplifier as the eighteenth embodiment in the rare-earth ion with which the core of the optical fiber 253 is doped and the coatings applied to the light entrance end surface 253a and the light exit end surface 253b of the optical fiber 253.

That is, in the nineteenth embodiment, the core of the optical fiber 253 is doped with 1 atomic percent (atm %) of $Sm^{3+}$ instead of $Ho^{3+}$. In addition, the laser diode 211 used in the nineteenth embodiment emits a laser beam having the wavelength of 404 nm. Further, the light entrance end surface 253a and the light exit end surface 253b of the optical fiber 253 are coated to be antireflective (AR) at the wavelengths of 566 nm (the wavelength of the fluorescence generated by the transition from $^4G_{5/2}$ to $^6H_{5/2}$ in the core of the optical fiber 253) and 404 nm (the wavelength of the excitation laser beam 210).

In the fiber laser amplifier as the nineteenth embodiment, the applicants have obtained the amplified laser beam 255' from the optical fiber 253 with the output power of 100 mW when the output power of the SHG laser unit 256 is 1.5 mW.

Alternatively, the coatings applied to the light entrance end surface 253a and the light exit end surface 253b of the optical fiber 253 may be arranged so that a laser beam having a wavelength of 615 or 650 nm is amplified in the optical fiber 253, since the $Sm^{3+}$-doped core of the optical fiber 253 can generate the fluorescence having the wavelength of 615 nm by the transition from $^4G_{5/2}$ to $^6H_{7/2}$ and the fluorescence having the wavelength of 650 nm by the transition from $^4F_{3/2}$ to $^6H_{11/2}$.

Twentieth Embodiment

The twentieth embodiment of the present invention is explained below. Since the construction of the fiber laser amplifier as the twentieth embodiment of the present invention also has the same construction as the eighteenth embodiment except for the portions of the construction explained below, the reference numerals in FIG. 5 are also referred to in the following explanations of the twentieth embodiment.

The fiber laser amplifier as the twentieth embodiment is different from the fiber laser amplifier as the eighteenth embodiment in the rare-earth ion with which the core of the optical fiber 253 is doped and the coatings applied to the light entrance end surface 253a and the light exit end surface 253b of the optical fiber 253.

That is, in the twentieth embodiment, the core of the optical fiber 253 is doped with 1 atomic percent (atm %) of $Eu^{3+}$ instead of $Ho^{3+}$. In addition, the laser diode 211 used in the twentieth embodiment emits a laser beam having the wavelength of 394 nm. Further, the light entrance end surface 253a and the light exit end surface 253b of the optical fiber 253 are coated to be antireflective (AR) at the wavelengths of 589 nm (the wavelength of the fluorescence generated by the transition from $^5D_0$ to $^7F_2$ in the core of the optical fiber 253) and 394 nm (the wavelength of the excitation laser beam 210).

In the fiber laser amplifier as the twentieth embodiment, the applicants have obtained the amplified laser beam 255' from the optical fiber 253 with the output power of 50 mW when the output power of the SHG laser unit 256 is 1 mW.

Twenty-First Embodiment

The twenty-first embodiment of the present invention is explained below. Since the construction of the fiber laser amplifier as the twenty-first embodiment of the present invention has the same construction as the eighteenth embodiment except for the portions of the construction explained below, the reference numerals in FIG. 5 are also referred to in the following explanations of the twenty-first embodiment.

The fiber laser amplifier as the twenty-first embodiment is different from the fiber laser amplifier as the eighteenth embodiment in the rare-earth ion with which the core of the optical fiber 253 is doped and the coatings applied to the light entrance end surface 253a and the light exit end surface 253b of the optical fiber 253.

That is, in the twenty-first embodiment, the core of the optical fiber 253 is doped with 1 atomic percent (atm %) of $Dy^{3+}$ instead of $Ho^{3+}$. In addition, the laser diode 211 used in the twenty-first embodiment emits a laser beam having the wavelength of 390 nm. Further, the light entrance end surface 253a and the light exit end surface 253b of the optical fiber 253 are coated to be antireflective (AR) at the wavelengths of 572 nm (the wavelength of the fluorescence generated by the transition from $^4F_{9/2}$ to $^6H_{13/2}$ in the core of the optical fiber 253) and 390 nm (the wavelength of the excitation laser beam 210).

In the fiber laser amplifier as the twenty-first embodiment, the applicants have obtained the amplified laser beam 255' from the optical fiber 253 with the output power of 80 mW when the output power of the SHG laser unit 256 is 1.5 mW.

Alternatively, the coatings applied to the light entrance end surface 253a and the light exit end surface 253b of the optical fiber 253 may be arranged so that a laser beam having the wavelength of 664 nm is amplified in the optical fiber 253, since the $Dy^{3+}$-doped core of the optical fiber 253 can generate the fluorescence having the wavelength of 664 nm by the transition from $^4F_{9/2}$ to $^6H_{11/2}$.

Twenty-Second Embodiment

The twenty-second embodiment of the present invention is explained below. Since the construction of the fiber laser amplifier as the twenty-second embodiment of the present invention has the same construction as the eighteenth embodiment except for the portions of the construction explained below, the reference numerals in FIG. 5 are also referred to in the following explanations of the twenty-second embodiment.

The fiber laser amplifier as the twenty-second embodiment is different from the fiber laser amplifier as the eighteenth embodiment in the rare-earth ion with which the core of the optical fiber 253 is doped and the coatings applied to the light entrance end surface 253a and the light exit end surface 253b of the optical fiber 253.

That is, in the twenty-second embodiment, the core of the optical fiber 253 is doped with 1 atomic percent (atm %) of $Er^{3+}$ instead of $Ho^{3+}$. In addition, the laser diode 211 used in the twenty-second embodiment emits a laser beam having the wavelength of 406 nm. Further, the light entrance end surface 253a and the light exit end surface 253b of the optical fiber 253 are coated to be antireflective (AR) at the wavelengths of 554 nm (the wavelength of the fluorescence generated by the transition from $^2H_{9/2}$ to $^4I_{13/2}$ in the core of the optical fiber 253) and 406 nm (the wavelength of the excitation laser beam 210).

In the fiber laser amplifier as the twenty-second embodiment, the applicants have obtained the amplified laser beam 255' from the optical fiber 253 with the output power of 80 mW when the output power of the SHG laser unit 256 is 1 mW.

Alternatively, the coatings applied to the light entrance end surface 253a and the light exit end surface 253b of the optical fiber 253 may be arranged so that a laser beam having the wavelength of 540 nm is amplified in the optical fiber 253, since the $Er^{3+}$-doped core of the optical fiber 253 can generate the fluorescence having the wavelength of 540 nm by the transition from $^4S_{3/2}$ to $^4I_{15/2}$.

In addition, the excitation wavelength may be 380 nm instead of 406 nm.

Twenty-Third Embodiment

The twenty-third embodiment of the present invention is explained below. Since the construction of the fiber laser amplifier as the twenty-third embodiment of the present invention also has the same construction as the eighteenth embodiment except for the portions of the construction explained below, the reference numerals in FIG. 5 are also referred to in the following explanations of the twenty-third embodiment.

The fiber laser amplifier as the twenty-third embodiment is different from the fiber laser amplifier as the eighteenth embodiment in the rare-earth ion with which the core of the optical fiber 253 is doped and the coatings applied to the light entrance end surface 253a and the light exit end surface 253b of the optical fiber 253.

That is, in the twenty-third embodiment, the core of the optical fiber 253 is doped with 1 atomic percent (atm %) of $Tb^{3+}$ instead of $Ho^{3+}$. In addition, the laser diode 211 used in the twenty-third embodiment emits a laser beam having the wavelength of 380 nm. Further, the light entrance end surface 253a and the light exit end surface 253b of the optical fiber 253 are coated to be antireflective (AR) at the wavelengths of 540 nm (the wavelength of the fluorescence generated by the transition from $^5D_4$ to $^7F_5$ in the core of the optical fiber 253) and 380 nm (the wavelength of the excitation laser beam 210).

In the fiber laser amplifier as the twenty-third embodiment, the applicants have obtained the amplified laser beam 255' from the optical fiber 253 with the output power of 70 mW when the output power of the SHG laser unit 256 is 1.5 mW.

Variations of Twelfth to Twenty-Third Embodiments

The active layers of the laser diodes used as excitation light sources in the constructions of the twelfth to twenty-third embodiments can be made of an InGaN-based, InGaNAs-based, or GaNAs-based compound material. In particular, when an absorption band of a solid-state laser crystal is located on the longer wavelength side of the output wavelength of the laser diode, it is preferable to use the InGaNAs-based or GaNAs-based compound material, since the wavelength of the laser oscillation in the InGaNAs-based or GaNAs-based compound laser diode can be lengthened more easily than that in the InGaN-based compound laser diode. That is, the absorption efficiency in the InGaNAs-based or GaNAs-based compound laser diode can be enhanced more easily than that in the InGaN-based compound laser diode.

What is claimed is:

1. A laser-diode-excited solid-state laser apparatus comprising:

a GaN-based compound laser diode which emits an excitation laser beam; and a solid-state laser crystal which is doped with $Ho^{3+}$, and emits a solid-state laser beam generated by one of a first transition from $^5S_2$ to $^5I_7$ and a second transition from $^5S_2$ to $^5I_8$ when the solid-state laser crystal is excited with said excitation laser beam, wherein the solid-state laser crystal produces both the first transition and the second transition when the solid-state laser crystal is excited with said excitation laser beam, and the solid-state laser crystal includes a first coating disposed on a backward end surface of the solid-state laser crystal and a second coating disposed on a forward end surface of the solid-state laser crystal, which enable the solid-state crystal to emit the solid-state laser beam generated by one of the first transition and the second transition.

2. A laser-diode-excited solid-state laser apparatus according to claim 1, wherein said solid-state laser beam is generated by said first transition from $^5S_2$ to $^5I_7$ and is in a wavelength range of 740 to 760 nm.

3. A laser-diode-excited solid-state laser apparatus according to claim 1, wherein said solid-state laser beam is generated by said second transition from $^5S_2$ to $^5I_8$ and is in a wavelength range of 540 to 560 nm.

4. A laser-diode-excited solid-state laser apparatus according to claim 1, wherein said solid-state laser crystal is doped with no rare-earth ion other than $Ho^{3+}$.

5. A laser-diode-excited solid-state laser apparatus according to claim 1, wherein said GaN-based compound laser diode has an active layer made of one of InGaN, InGaNAs, and GaNAs materials.

6. A laser-diode-excited solid-state laser apparatus comprising:
   a laser diode which has an active layer made of one of InGaN, InGaNAs, and GaNAs materials, and emits an excitation laser beam;
   a solid-state laser crystal which is doped with at least one rare-earth ion including $Ho^{3+}$, and emits a solid-state laser beam generated by one of a first transition from $^5S_2$ to $^5I_7$ and a second transition from $^5S_2$ to $^5I_8$ when the solid-state laser crystal is excited with said excitation laser beam; and
   an optical wavelength conversion element which converts said solid-state laser beam into ultraviolet laser light by wavelength conversion,
   wherein the solid-state laser crystal produces both the first transition and the second transition when the solid-state laser crystal is excited with said excitation laser beam, and
   the solid-state laser crystal includes a first coating disposed on a backward end surface of the solid-state laser crystal and a second coating disposed on a forward end surface of the solid-state laser crystal, which enable the solid-state crystal to emit the solid-state laser beam generated by one of the first transition and the second transition.

7. A laser-diode-excited solid-state laser apparatus according to claim 6, wherein said solid-state laser beam is generated by said first transition from $^5S_2$ to $^5I_7$ and has a wavelength of about 750 nm, and said ultraviolet laser light has a wavelength of about 375 nm.

8. A laser-diode-excited solid-state laser apparatus according to claim 6, wherein said solid-state laser beam is generated by said second transition from $^5S_2$ to $^5I_8$ and has a wavelength of about 550 nm, and said ultraviolet laser light has a wavelength of about 275 nm.

9. A laser-diode-excited solid-state laser apparatus according to claim 6, wherein said solid-state laser crystal is doped with no rare-earth ion other than $Ho^{3+}$.

10. A laser-diode-excited solid-state laser apparatus according to claim 6, wherein said optical wavelength conversion element is realized by a nonlinear optical crystal having a periodic domain-inverted structure.

11. A fiber laser apparatus comprising:
    a GaN-based compound laser diode which emits a first laser beam; and
    an optical fiber which has a core doped with $Ho^{3+}$, and emits a second laser beam generated by one of a first transition from $^5S_2$ to $^5I_7$ and a second transition from $^5S_2$ to $^5I_8$ when the optical fiber is excited with said first laser beam,
    wherein the optical fiber produces both the first transition and the second transition when the optical fiber is excited with said first laser beam, and
    the optical fiber includes a first coating disposed on a light entrance end surface of the optical fiber and a second coating disposed on a light exit end surface of the optical fiber, which enable the optical fiber to emit the second laser beam generated by one of the first transition and the second transition.

12. A fiber laser apparatus according to claim 11, wherein said second laser beam is generated by said first transition from $^5S_2$ to $^5I_7$ and is in a wavelength range of 740 to 760 nm.

13. A fiber laser apparatus according to claim 11, wherein said second laser beam is generated by said second transition from $^5S_2$ to $^5I_8$ and is in a wavelength range of 540 to 560 nm.

14. A fiber laser apparatus according to claim 11, wherein said core of said optical fiber is doped with no rare-earth ion other than $Ho^{3+}$.

15. A fiber laser apparatus according to claim 11, wherein said GaN-based compound laser diode has an active layer made of one of InGaN, InGaNAs, and GaNAs materials.

16. A fiber laser amplifier comprising:
    a GaN-based compound laser diode which emits an excitation laser beam; and
    an optical fiber which has a core doped with $Ho^{3+}$, and amplifies incident light which has a wavelength within a wavelength range of fluorescence generated by one of a first transition from $^5S_2$ to $^5I_7$ and a second transition from $^5S_2$ to $^5I_8$ when the optical fiber is excited with said excitation laser beam,
    wherein the optical fiber produces both the first transition and the second transition when the optical fiber is excited with said excitation laser beam, and
    the optical fiber includes a first coating disposed on a light entrance end surface of the optical fiber and a second coating disposed on a light exit end surface of the optical fiber, which enable the optical fiber to amplify the incident light having the wavelength within the wavelength range of fluorescence generated by one of the first transition and the second transition.

17. A fiber laser amplifier according to claim 16, wherein said fluorescence is generated by said first transition from $^5S_2$ to $^5I_7$ and is in a wavelength range of 740 to 760 nm.

18. A fiber laser amplifier according to claim 16, wherein said fluorescence is generated by said second transition from $^5S_2$ to $^5I_8$ and is in a wavelength range of 540 to 560 nm.

19. A fiber laser amplifier according to claim 16, wherein said core of said optical fiber is doped with no rare-earth ion other than $Ho^{3+}$.

20. A fiber laser amplifier according to claim 16, wherein said GaN-based compound laser diode has an active layer made of one of InGaN, InGaNAs, and GaNAs materials.

* * * * *